(12) United States Patent
Takamine

(10) Patent No.: US 11,699,991 B2
(45) Date of Patent: Jul. 11, 2023

(54) MULTIPLEXER, HIGH FREQUENCY FRONT-END CIRCUIT, AND COMMUNICATION APPARATUS

(71) Applicant: Murata Manufacturing Co., Ltd., Nagaokakyo (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 463 days.

(21) Appl. No.: 16/874,738

(22) Filed: May 15, 2020

(65) Prior Publication Data

US 2020/0280303 A1   Sep. 3, 2020

Related U.S. Application Data

(63) Continuation of application No. PCT/JP2018/044589, filed on Dec. 4, 2018.

(30) Foreign Application Priority Data

Dec. 6, 2017   (JP) ................. 2017-234486

(51) Int. Cl.
*H03H 9/00* (2006.01)
*H03H 9/64* (2006.01)
(Continued)

(52) U.S. Cl.
CPC ...... *H03H 9/6483* (2013.01); *H03H 9/02566* (2013.01); *H03H 9/02992* (2013.01);
(Continued)

(58) Field of Classification Search
CPC ............ H03H 9/6483; H03H 9/02566; H03H 9/02992; H03H 9/14502; H03H 9/176; H03H 9/6479; H03H 9/725
See application file for complete search history.

(56) References Cited

U.S. PATENT DOCUMENTS 9,041,484 B2 * 5/2015 Burgener ................. H03H 9/54
333/133
2001/0008387 A1   7/2001 Taniguchi
(Continued)

FOREIGN PATENT DOCUMENTS

CN      111133678      * 5/2020
EP      2131493 A1 * 12/2009 ........... H03H 9/0071
(Continued)

OTHER PUBLICATIONS

Official Communication issued in International Patent Application No. PCT/JP2018/044589, dated Feb. 19, 2019.

*Primary Examiner* — Tuan T Lam
(74) *Attorney, Agent, or Firm* — Keating & Bennett, LLP

(57) ABSTRACT

A multiplexer includes a transmission-side filter electrically connected to a common terminal and a transmission input terminal, and a transmission-side filter electrically connected to the common terminal and a transmission input terminal. The transmission-side filter includes a plurality of series arm resonators and a plurality of parallel arm resonators. Capacitance elements are respectively electrically connected in parallel to the series arm resonator and the parallel arm resonator, which are connected most proximately to the common terminal. IDT electrodes of a series arm resonator and a parallel arm resonator connected most proximately to the common terminal do not include a thinning electrode, and others of the series arm resonators and the parallel arm resonators include thinning electrodes.

18 Claims, 13 Drawing Sheets

(51) Int. Cl.
*H03H 9/02* (2006.01)
*H03H 9/145* (2006.01)
*H03H 9/17* (2006.01)
*H03H 9/72* (2006.01)

(52) U.S. Cl.
CPC ........ *H03H 9/14502* (2013.01); *H03H 9/176* (2013.01); *H03H 9/6479* (2013.01); *H03H 9/725* (2013.01)

(56) References Cited

U.S. PATENT DOCUMENTS

| | | |
|---|---|---|
| 2004/0027213 A1 | 2/2004 | Takata |
| 2007/0173210 A1* | 7/2007 | Cho .................. H04B 1/52 455/78 |
| 2012/0032753 A1 | 2/2012 | Nishimura et al. |
| 2012/0306591 A1* | 12/2012 | Nishihara .............. H03H 9/173 333/133 |
| 2015/0070227 A1 | 3/2015 | Kishino et al. |
| 2017/0279432 A1 | 9/2017 | Murase |
| 2018/0159497 A1 | 6/2018 | Iwamoto et al. |

FOREIGN PATENT DOCUMENTS

| | | | |
|---|---|---|---|
| JP | 2001-203556 A | | 7/2001 |
| JP | 2004-023611 A | | 1/2004 |
| JP | 2011-146768 A | | 7/2011 |
| JP | 2014-143675 A | | 8/2014 |
| JP | 2020123819 | * | 8/2020 |
| WO | WO2016190216 A1 | * | 12/2006 |
| WO | 2010/122786 A1 | | 10/2010 |
| WO | 2014/034492 A1 | | 3/2014 |
| WO | 2016/111315 A1 | | 7/2016 |
| WO | WO 2016190216 A1 | * | 12/2016 |
| WO | 2017/043427 A1 | | 3/2017 |
| WO | WO-2022158470 A1 | * | 7/2022 |

* cited by examiner

MULTIPLEXER, HIGH FREQUENCY FRONT-END CIRCUIT, AND COMMUNICATION APPARATUS

CROSS REFERENCE TO RELATED APPLICATIONS

This application claims the benefit of priority to Japanese Patent Application No. 2017-234486 filed on Dec. 6, 2017 and is a Continuation Application of PCT Application No. PCT/JP2018/044589 filed on Dec. 4, 2018. The entire contents of each application are hereby incorporated herein by reference.

BACKGROUND OF THE INVENTION

1. Field of the Invention

The present invention relates to a multiplexer including an acoustic wave filter, a high frequency front-end circuit, and a communication apparatus.

2. Description of the Related Art

In a multiplexer configured to demultiplex or multiplex multi-band high frequency signals, the band width of a frequency band in use varies from a narrow band to a broadband, and the multiplexer includes a plurality of band pass filters corresponding to these frequency bands. For example, an acoustic wave filter corresponding to Band 30 (transmission band: 2305 MHz to 2315 MHz, reception band: 2350 MHz to 2360 MHz) of Long Term Evolution (LTE) is required to support a pass band of a narrow band (fractional band: about 0.43%). For example, an acoustic wave resonator with a resonance band width (an interval between a resonant frequency and an anti-resonant frequency) being narrow may be applied to achieve a band pass filter of a narrow band.

Japanese Unexamined Patent Application Publication No. 2001-203556 discloses that, as a method of narrowing a resonance band width, a thinning electrode is formed in a portion of an interdigital transducer (IDT) electrode of a surface acoustic wave resonator, so that an electromechanical coupling coefficient of the surface acoustic wave resonator is substantially reduced to narrow the resonance band width.

However, as in Japanese Unexamined Patent Application Publication No. 2001-203556, when a thinning electrode is formed in a portion of the IDT electrode to achieve a narrow band filter, a periodic structure by the thinning electrode is formed separately from a periodic structure of the IDT electrode pitch. Accordingly, a frequency response corresponding to the periodic structure by the thinning electrode, which is different from a frequency response of the main mode corresponding to the periodic structure of the IDT electrode pitch, is generated, and the generated frequency response appears as a spurious signal (unwanted wave) outside the pass band.

When a multiplexer is formed by an acoustic wave filter including an acoustic wave resonator including an IDT electrode in which the above-described thinning electrode is formed, the spurious signal appears in the acoustic wave filter. There is a problem that the spurious signal causes a ripple to be generated in a pass band of another filter connected to a common terminal, and thus insertion loss in the band of another filter is increased.

SUMMARY OF THE INVENTION

Preferred embodiments of the present invention provide multiplexers, high frequency front-end circuits, and communication apparatuses that are each able to provide, while narrowing a band of one filter, low loss of another filter in the multiplexer in which a plurality of filters are electrically connected to a common terminal.

A multiplexer according to a preferred embodiment of the present invention includes a common terminal, a first input-output terminal, and a second input-output terminal; a first filter electrically connected to the common terminal and the first input-out terminal; and a second filter having a pass band different from that of the first filter, and electrically connected to the common terminal and the second input-output terminal. The first filter includes a plurality of series arm resonators provided on a path connecting the common terminal and the first input-output terminal, and a plurality of parallel arm resonators provided between the above-mentioned path and the ground. Each of the plurality of series arm resonators and the plurality of parallel arm resonators is an acoustic wave resonator including an interdigital transducer (IDT) electrode provided on a substrate having piezoelectricity. A capacitance element is electrically connected in parallel to at least one of a first series arm resonator, which is a series arm resonator connected most proximately to the common terminal among the plurality of series arm resonators, and a first parallel arm resonator, which is a parallel arm resonator connected most proximately to the common terminal among the plurality of parallel arm resonators, and the IDT electrode included in the at least one of the first series arm resonator and the first parallel arm resonator does not include a thinning electrode. The IDT electrode included in at least one of the series arm resonators excluding the first series arm resonator among the plurality of series arm resonators and the parallel arm resonators excluding the first parallel arm resonator among the plurality of parallel arm resonators, includes a thinning electrode.

Accordingly, a thinning electrode is provided in at least one of the acoustic wave resonators excluding the first series arm resonator and the first parallel arm resonator in close proximity to the common terminal in the first filter, and a capacitance element is electrically connected in parallel to at least one of the first series arm resonator and the first parallel arm resonator. As described above, by providing the thinning electrode in the acoustic wave resonator or connecting the capacitance element in parallel to the acoustic wave resonator, the band of the first filter is able to be narrowed.

On the other hand, it is assumed that a spurious signal is generated outside the pass band due to the thinning electrode provided in the acoustic wave resonator of the first filter, and that a frequency of the spurious signal generation is included in the pass band of the second filter. In contrast, since a thinning electrode is not provided in at least one of the first series arm resonator and the first parallel arm resonator, which are branches near the common terminal of the first filter, an increase in return loss in the pass band of the second filter is able to be significantly reduced or prevent when the first filter is seen from the common terminal. This is because an influence on reflection characteristics becomes larger when the first filter is seen from the common terminal, as a branch becomes closer to the common terminal of the first filter. Accordingly, the deterioration in bandpass characteristics of the second filter caused by an unwanted wave generated by the first filter is able to be significantly reduced or prevented. Accordingly, in a multiplexer in which a plurality of filters are electrically connected to the common terminal, while narrowing the band of one filter, low loss of another filter is able to be provided.

No capacitance element may be electrically connected in parallel to each of the series arm resonators excluding the first series arm resonator among the plurality of series arm resonators, and each of the parallel arm resonators excluding the first parallel arm resonator among the plurality of parallel arm resonators.

By connecting the capacitance element in parallel to an acoustic wave resonator, the resonance band width of the acoustic wave resonator may be reduced, but a Q-value of the acoustic wave resonator decreases caused by a Q-value of the capacitance element. Accordingly, the location of the capacitance element that narrows the band of the first filter is limited to at least one of the first series arm resonator and the first parallel arm resonator, and no capacitance element is provided in each of the series arm resonators excluding the first series arm resonator and each of the parallel arm resonators excluding the first parallel arm resonator. Accordingly, in a multiplexer in which a plurality of filters are electrically connected to a common terminal, while reducing the loss of and narrowing the band of one filter, low loss of another filter is able to be provided.

Each of the series arm resonators excluding the first series arm resonator among the plurality of series arm resonators and each of the parallel arm resonators excluding the first parallel arm resonator among the plurality of parallel arm resonators, may include a thinning electrode.

By connecting the capacitance element in parallel to the acoustic wave resonator, the resonance band width of the acoustic wave resonator may be reduced, but the Q-value of the acoustic wave resonator decreases caused by the Q-value of the capacitance element. Accordingly, the location of the capacitance element that narrows the band of the first filter is limited to at least one of the first series arm resonator and the first parallel arm resonator, and a thinning electrode is provided in each of the series arm resonators excluding the first series arm resonator and each of the parallel arm resonators excluding the first parallel arm resonator. Accordingly, in a multiplexer in which a plurality of filters is electrically connected to a common terminal, while reducing the loss of and further narrowing the band of one filter, low loss of another filter is able to be provided.

The capacitance element may include a comb-tooth electrode provided on the substrate.

Accordingly, a circuit in which the acoustic wave resonator and the capacitance element are electrically connected in parallel is able to be significantly reduced in size, and thus the multiplexer may be significantly reduced in size.

The comb-tooth electrode may include a plurality of electrode fingers in parallel or substantially in parallel to one another and a pair of busbars that oppose each other across the plurality of electrode fingers. The plurality of electrode fingers may be provided along a propagation direction of the acoustic wave in the IDT electrode, and may also be provided periodically along a direction orthogonal or substantially orthogonal to the propagation direction.

Accordingly, a situation in which an unwanted wave generated in the capacitance element interferes with the acoustic wave propagating through the IDT electrode is able to be significantly reduced or prevented.

The substrate may include a piezoelectric film including the IDT electrode provided on one surface of the piezoelectric film, a high acoustic velocity support substrate through which a bulk wave propagates at a higher acoustic velocity than an acoustic velocity of the acoustic wave that propagates through the piezoelectric film, and a low acoustic velocity film which is provided between the high acoustic velocity support substrate and the piezoelectric film, and through which a bulk wave propagates at a lower acoustic velocity than an acoustic velocity of a bulk wave that propagates through the piezoelectric film.

When a capacitance element is electrically connected in parallel to an acoustic wave resonator, it is assumed that the Q-value of the acoustic wave resonator is decreased equivalently. However, according to a laminated structure of the substrate, the Q-value of the acoustic wave resonator is able to be maintained at a high value. Therefore, an acoustic wave filter exhibiting low loss in the pass band is able to be provided.

The multiplexer may include a first duplexer provided with two filters including the first filter, and a second duplexer provided with two filters including the second filter.

Thus, in the multiplexer including a plurality of duplexers, the deterioration in bandpass characteristics of the second filter caused by the unwanted wave generated by the first filter is able to be significantly reduced or prevented while narrowing the band of the first filter.

The pass band of the first filter may be an uplink frequency band in Band 30 of Long Term Evolution (LTE), and the pass band of the second filter may be an uplink frequency band in Band 25 of the LTE.

When the pass band of the first filter is an uplink frequency band in Band 30 of the LTE, and the pass band of the second filter is an uplink frequency band in Band 25 of the LTE, it is assumed that a spurious signal generation frequency of the first filter is located within the pass band of the second filter in some cases. Accordingly, the increase in the return loss in the pass band of the second filter is able to be significantly reduced or prevented when the first filter is seen from the common terminal. Accordingly, the deterioration in bandpass characteristics of the second filter caused by the spurious signal generated by the first filter is able to be significantly reduced or prevented while applying the first filter to Band 30, which is a narrow band.

A high frequency front-end circuit according to a preferred embodiment of the present invention includes a multiplexer according to a preferred embodiment of the present invention, and an amplifier circuit electrically connected to the multiplexer.

Accordingly, a high frequency front-end circuit is able to be provided in which, while narrowing the band of one filter defining a multiplexer, low loss of another filter defining the multiplexer is provided.

A communication apparatus according to a preferred embodiment of the present invention includes an RF signal processing circuit that processes a high frequency signal transmitted and received by an antenna element, and a high frequency front-end circuit according to a preferred embodiment of the present invention that transmits the high frequency signal between the antenna element and the RF signal processing circuit.

Accordingly, a communication apparatus is able to be provided in which, while narrowing the band of one filter defining a multiplexer, low loss of another filter defining the multiplexer is provided.

According to the multiplexers, the high frequency front-end circuits, and the communication apparatuses according to preferred embodiments of the present invention, while narrowing the band of one filter, low loss of another filter is able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
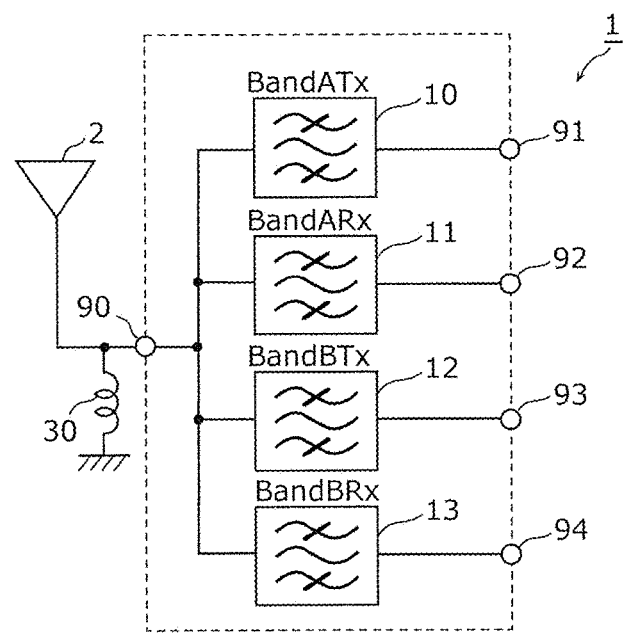
FIG. 1 is a diagram of a multiplexer and its peripheral circuit according to a first preferred embodiment of the present invention.

Hereinafter, preferred embodiments of the present invention will be described in detail with respect to the preferred embodiments and drawings. It is to be noted that any of the preferred embodiments described below represents a general or specific example. Numeric values, shapes, materials, elements, structure, locations, and connections of the elements, and the like described in the following preferred embodiments are mere examples and are not intended to limit the present invention. Of the elements in the following preferred embodiments, elements that are not described in the independent claims are described as arbitrary or optional elements. The sizes or the size ratios of the components and elements shown in the drawings are not necessarily strict.

First Preferred Embodiment

1. Basic Configuration of Multiplexer

FIG. 1 is a diagram of a multiplexer 1 and its peripheral circuit according to a first preferred embodiment of the present invention. As shown in FIG. 1, the multiplexer 1 includes transmission-side filters 10 and 12, reception-side filters 11 and 13, a common terminal 90, transmission input terminals 91 and 93, and reception output terminals 92 and 94. The multiplexer 1 is connected to an antenna element 2 at the common terminal 90. An inductance element 30 providing impedance matching is connected between a connection path between the common terminal 90 and the antenna element 2, and the ground defining and functioning as a reference terminal. The inductance element 30 may be connected in series between the common terminal 90 and the antenna element 2. The multiplexer 1 may not include the inductance element 30. The inductance element 30 may be included in the multiplexer 1, or may be externally attached to the multiplexer 1.

The transmission-side filter 10 is a first filter that is connected to the common terminal 90 and the transmission input terminal 91 (first input-output terminal), inputs a transmission wave generated by a transmission circuit (for example, an RFIC) via the transmission input terminal 91, and performs filtering on the transmission wave in a transmission pass band of Band A to output the filtered transmission wave to the common terminal 90. The transmission-side filter 10 is preferably, for example, a surface acoustic wave filter defined by an acoustic wave resonator, and includes a plurality of series arm resonators provided on a path connecting the common terminal 90 and the transmission input terminal 91, and a plurality of parallel arm resonators provided between the above path and the ground.

The reception-side filter 11 is a filter that is connected to the common terminal 90 and the reception output terminal 92, inputs a reception wave inputted from the common terminal 90, and performs filtering on the reception wave in a reception pass band of Band A to output the filtered reception wave to the reception output terminal 92. The reception-side filter 11 is not particularly limited, and may preferably be, for example, an acoustic wave filter, or may be an LC filter including an inductance element and a capacitance element.

The transmission-side filter 12 is a second filter that is connected to the common terminal 90 and the transmission input terminal 93 (second input-output terminal), inputs a transmission wave generated by a transmission circuit (for example, an RFIC) via the transmission input terminal 93 (second input-output terminal), and performs filtering on the transmission wave in a transmission pass band of Band B, which is different from Band A), to output the filtered transmission wave to the common terminal 90. The transmission-side filter 12 is not particularly limited, and may preferably be, for example, an acoustic wave filter, or may be an LC filter including an inductance element and a capacitance element.

The reception-side filter 13 is a filter that is connected to the common terminal 90 and the reception output terminal 94, is inputted with a reception wave inputted from the common terminal 90, and performs filtering on the reception wave in a reception pass band of Band B to output the filtered reception wave to the reception output terminal 94. The reception-side filter 13 is not particularly limited, and may preferably be, for example, an acoustic wave filter, or may be an LC filter including an inductance element and a capacitance element.

At least one of an inductance element and a capacitance element providing impedance matching may be connected between the common terminal 90 and each of the above-described filters.

Hereinafter, the structure of an acoustic wave resonator defining the transmission-side filter 10 is described.

2. Structure of Acoustic Wave Resonator

Figure 2A:
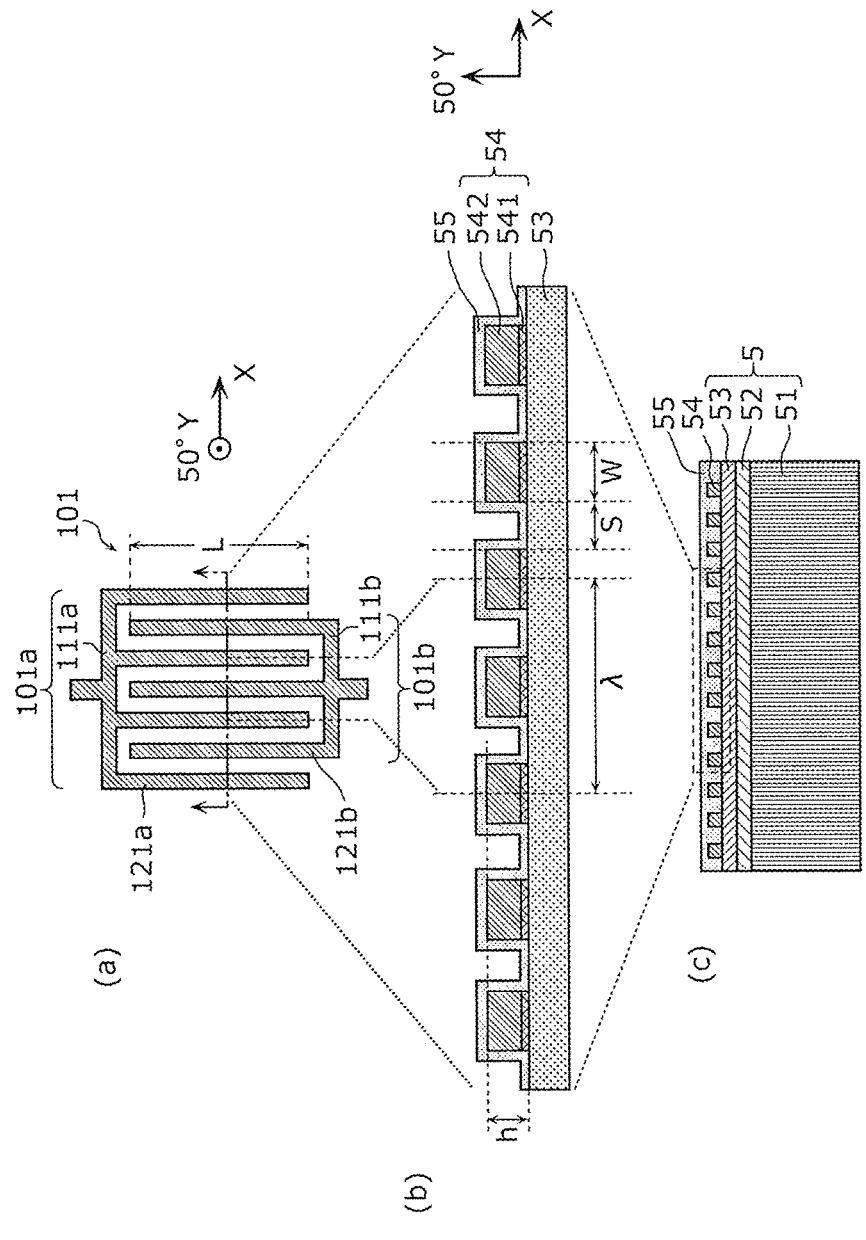
FIG. 2A includes a plan view and a cross-sectional view showing an example of an acoustic wave resonator according to the first preferred embodiment of the present invention.

FIG. 2A is a diagram showing an example of an acoustic wave resonator according to the first preferred embodiment, where part (a) of FIG. 2A is a plan view, and parts (b) and (c) of FIG. 2A are each a cross-sectional view taken along a dot-dash line shown in part (a) of FIG. 2A. In FIG. 2A, there are exemplified a plan view and cross-sectional views showing the structure of a series arm resonator 101, which is connected most proximately to the common terminal 90 among the plurality of series arm resonators and the plurality of parallel arm resonators defining the transmission-side filter 10. The series arm resonator 101 shown in FIG. 2A provides an example of a structure of the plurality of acoustic wave resonators, and the number, length, and the like of electrode fingers defining the electrode are not limited thereto.

The series arm resonator 101 includes a substrate 5 having piezoelectricity and comb-shaped electrodes 101a and 101b.

As shown in part (a) of FIG. 2A, a pair of comb-shaped electrodes 101a and 101b opposing each other is provided on the substrate 5. The comb-shaped electrode 101a is defined by a plurality of electrode fingers 121a parallel or substantially parallel to one another and a busbar electrode 111a connecting the plurality of electrode fingers 121a. The comb-shaped electrode 101b is defined by a plurality of electrode fingers 121b parallel or substantially parallel to one another and a busbar electrode 111b connecting the plurality of electrode fingers 121b. The plurality of electrode fingers 121a and the plurality of electrode fingers 121b extend along a direction orthogonal or substantially orthogonal to an acoustic wave propagation direction (X-axis direction).

An interdigital transducer (IDT) electrode 54 defined by the plurality of electrode fingers 121a, the plurality of electrode fingers 121b, and the busbar electrodes 111a and 111b has, for example, a laminated structure of a close contact layer 541 and a main electrode layer 542, as shown in FIG. 2A(b).

The close contact layer 541 is a layer that significantly improves a close contact property between the substrate 5 and the main electrode layer 542, and Ti, for example, is preferably used as a material. The close contact layer 541 preferably has a film thickness of, for example, about 12 nm.

The main electrode layer 542 preferably includes, as a material thereof, Al including about 1% of Cu, for example. The film thickness of the main electrode layer 542 is preferably, for example, about 162 nm.

A protective layer 55 covers the comb-shaped electrodes 101a and 101b. The protective layer 55 is a layer to protect the main electrode layer 542 from the external environment, to adjust frequency temperature characteristics, to significantly increase moisture resistance, and the like, and is preferably, for example, a dielectric film mainly including silicon dioxide. The protective layer 55 preferably has a thickness of, for example, about 25 nm.

Materials that define the close contact layer 541, the main electrode layer 542, and the protective layer 55 are not limited to those described above. The IDT electrode 54 may not have the above-described laminated structure. The IDT electrode 54 may be made of a metal, for example, Ti, Al, Cu, Pt, Au, Ag, Pd or the like, or an alloy thereof, and may include a plurality of multilayer bodies including the above-mentioned metal or alloy, for example. Note that the protective layer 55 may not be provided.

Next, a laminated structure of the substrate 5 is described.

As shown in part (c) of FIG. 2A, the substrate 5 includes a high acoustic velocity support substrate 51, a low acoustic velocity film 52 and a piezoelectric film 53, and has a structure in which the high acoustic velocity support substrate 51, the low acoustic velocity film 52, and the piezoelectric film 53 are laminated in this order.

The piezoelectric film 53 preferably includes a 50° Y-cut X-propagation $LiTaO_3$ piezoelectric single crystal or piezoelectric ceramics (a lithium tantalate single crystal or ceramics being cut with a surface which takes, as its normal line, an axis rotated by about 50° from a Y-axis about an X-axis, that is, a single crystal or ceramics through which surface acoustic waves propagate in the X-axis direction). The piezoelectric film 53 preferably has, for example, a thickness of about 600 nm. In accordance with predetermined specifications of each of the filters, a material and cut-angles of a piezoelectric single crystal to be used as the piezoelectric film 53 are appropriately selected.

The high acoustic velocity support substrate 51 supports the low acoustic velocity film 52, the piezoelectric film 53, and the IDT electrode 54. The high acoustic velocity support substrate is also a substrate where acoustic velocity of a bulk wave propagating therein is higher than that of an acoustic wave, for example, a surface acoustic wave, a boundary wave and the like propagating in the piezoelectric film 53, and confines the surface acoustic wave in a portion where the piezoelectric film 53 and the low acoustic velocity film 52 are laminated, thus preventing the surface acoustic wave from leaking toward a lower side relative to the high acoustic velocity support substrate 51. The high acoustic velocity support substrate 51 is preferably, for example, a silicon substrate, and has a thickness of, for example, about 200 μm.

The low acoustic velocity film 52 is a film where the acoustic velocity of a bulk wave propagating therein is lower than that of a bulk wave propagating in the piezoelectric film 53, and is provided between the piezoelectric film 53 and the high acoustic velocity support substrate 51. Due to the above-described structure and the energy of the acoustic wave concentrating into a low acoustic velocity medium, leakage of surface acoustic wave energy to an outside of the IDT electrode is significantly reduced or prevented. The low acoustic velocity film 52 is preferably, for example, a film mainly including silicon dioxide, and has a thickness of, for example, about 670 nm.

According to the above-described laminated structure of the substrate 5, the Q-value at the resonant frequency and the anti-resonant frequency may be significantly increased as compared to a known structure in which a piezoelectric substrate is used in a single layer. That is, since the acoustic wave resonator having a high Q-value may be provided, a filter with low insertion loss is able to be provided by using the acoustic wave resonator.

As described herein, when a capacitance element is connected in parallel to the series arm resonator 101 in order to narrow the band of the transmission-side filter 10, it is assumed that the Q-value of the series arm resonator 101 is lowered equivalently caused by the Q-value of the capacitance element in some cases. However, according to the laminated structure of the substrate described above, the Q-value of the series arm resonator 101 is able to be maintained at a high value. Therefore, the acoustic wave filter exhibiting low loss in the pass band is able to be provided.

The high acoustic velocity support substrate 51 may have a structure in which a support substrate and a high acoustic velocity film where the acoustic velocity of the bulk wave propagating therein is higher than that of the acoustic wave, for example, a surface acoustic wave, a boundary wave or the like, propagating in the piezoelectric film 53, are laminated. In this case, the support substrate may include a piezoelectric body, for example, lithium tantalate, lithium niobate, quartz or the like, various ceramics, for example, alumina, magnesia, silicon nitride, aluminum nitride, silicon carbide, zirconia, cordierite, mullite, steatite, forsterite or the like, a dielectric, for example, sapphire, glass or the like, or a semiconductor, for example, silicon or gallium nitride, and a resin substrate or the like. For the high acoustic velocity film, various high acoustic velocity materials may be used, for example, aluminum nitride, aluminum oxide, silicon carbide, silicon nitride, silicon oxynitride, a DLC film or diamond, a medium including the above-described material as a main component, a medium including a mixture of the above materials as a main component and the like.

Figure 2B:
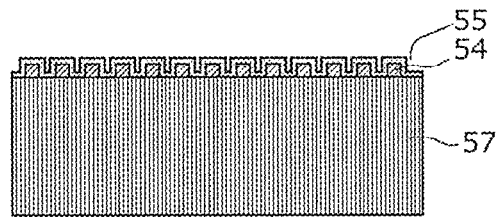
FIG. 2B is a cross-sectional view showing an acoustic wave resonator according to a first modification of the first preferred embodiment of the present invention.

FIG. 2B is a cross-sectional view showing an acoustic wave resonator according to a first modification of the first preferred embodiment. In the series arm resonator 101 shown in FIG. 2A, an example in which the IDT electrode 54 is provided on the substrate 5 having the piezoelectric film 53 is described, but the substrate on which the IDT electrode 54 is provided may be a piezoelectric single crystal substrate 57 including a single layer of a piezoelectric body layer as shown in FIG. 2B. The piezoelectric single crystal substrate 57 preferably includes, for example, a piezoelectric single crystal of $LiNbO_3$. A series arm resonator 101 according to the present modification includes the piezoelectric single crystal substrate 57 of $LiNbO_3$, an IDT electrode 54, and a protective layer 55 provided on the piezoelectric single crystal substrate 57 and on the IDT electrode 54.

In the piezoelectric film 53 and the piezoelectric single crystal substrate 57 described above, the laminated structure, material, cut-angles, and thickness may be appropriately changed in accordance with predetermined bandpass characteristics or the like of an acoustic wave filter device. Even in the series arm resonator 101 using, for example, a $LiTaO_3$ piezoelectric substrate having cut-angles other than the cut-angles described above, the same or similar effect as that of the series arm resonator 101 using the above-described piezoelectric film 53 may be provided.

Hereinafter, an example (working example) of electrode parameters of an IDT electrode defining an acoustic wave resonator is described.

The wavelength of an acoustic wave resonator is defined by a wavelength λ, which is a cycle period of the plurality of electrode fingers 121a or 121b defining the IDT electrode 54 as shown in part (b) of FIG. 2A. An electrode pitch is half the wavelength λ, and is defined as (W+S) when a line width of each of the electrode fingers 121a and 121b defining the comb-shaped electrodes 101a and 101b is W, and a space width between the adjacent electrode fingers 121a and 121b is S. An intersecting width L of the pair of comb-shaped electrodes 101a and 101b is a length of overlapping electrode fingers when viewed from the acoustic wave propagation direction (X-axis direction) of the electrode fingers 121a and 121b, as shown in part (a) of FIG. 2A. An electrode duty of each acoustic wave resonator is a line width occupancy rate of the plurality of electrode fingers 121a and the plurality of electrode fingers 121b, is a ratio of the line widths of the plurality of electrode fingers 121a and plurality of electrode fingers 121b to the addition value of the line widths and the space widths, and is defined as W/(W+S). The height of the comb-shaped electrodes 101a and 101b is defined as h. Parameters that determine the shape and size of the acoustic wave resonator, for example, the wavelength λ, the intersecting width L, the electrode duty, the height h of the IDT electrode 54 and the like, are referred to as resonator parameters.

3. Configuration of Transmission-Side Filter 10 According to Embodiment

Hereinafter, circuitry of a transmission-side filter 10 is described with reference to FIG. 3.

Figure 3:
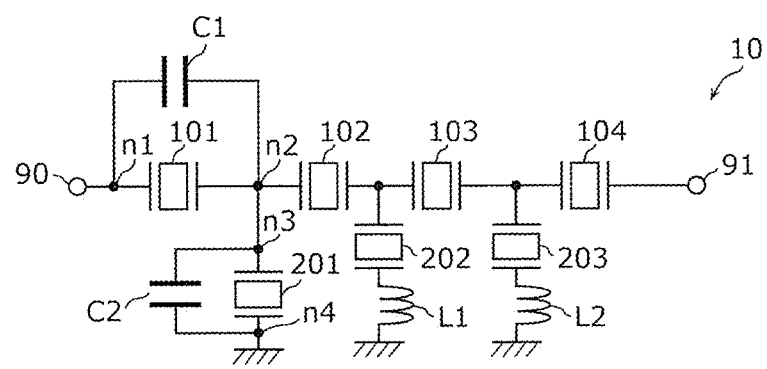
FIG. 3 is a circuit diagram of a transmission-side filter of Band A defining a multiplexer according to a working example.

FIG. 3 is a circuit diagram of the transmission-side filter 10 according to a working example. As shown in the drawing, the transmission-side filter 10 includes series arm resonators 101, 102, 103 and 104, parallel arm resonators 201, 202 and 203, capacitance elements C1 and C2, and inductance elements L1 and L2.

The series arm resonators 101 to 104 are provided on a path connecting the common terminal 90 and the transmission input terminal 91, and are connected in series to each other. The parallel arm resonators 201 to 203 are provided between nodes on the above-described path and a reference terminal (ground). The transmission-side filter 10 defines a ladder band pass filter by the above-described connections of the series arm resonators 101 to 104 and the parallel arm resonators 201 to 203.

The inductance element L1 is connected between the parallel arm resonator 202 and the ground, and the inductance element L2 is connected between the parallel arm resonator 203 and the ground. An attenuation pole near the pass band of the transmission-side filter 10 is adjusted by the inductance elements L1 and L2.

Note that the transmission-side filter 10 has a pass band as a narrow band, and the fractional band is substantially equal to or less than about 1%, for example. In order to support such narrow band filter characteristics, the transmission-side filter 10 is defined by an acoustic wave resonance circuit having a narrow resonance band width (a narrow interval between the resonant frequency and the anti-resonant frequency).

More specifically, the capacitance element C1 is connected in parallel to the series arm resonator 101, and the capacitance element C2 is connected in parallel to the parallel arm resonator 201. In other words, the series arm resonator 101 and the capacitance element C1 are connected in parallel at nodes n1 and n2, and the parallel arm resonator 201 and the capacitance element C2 are connected in parallel at nodes n3 and n4. Accordingly, the resonance band width of the series arm circuit where the series arm resonator 101 and the capacitance element C1 are connected in parallel is smaller than the resonance band width of the series arm resonator 101 alone. In addition, the resonance band width of the parallel arm circuit where the parallel arm resonator 201 and the capacitance element C2 are connected in parallel is smaller than the resonance band width of the parallel arm resonator 201 alone. Note that, as shown in FIG. 2A, the IDT electrodes included in the series arm resonator 101 and the parallel arm resonator 201 are provided on the substrate 5 and do not include a thinning electrode.

Figure 5A:
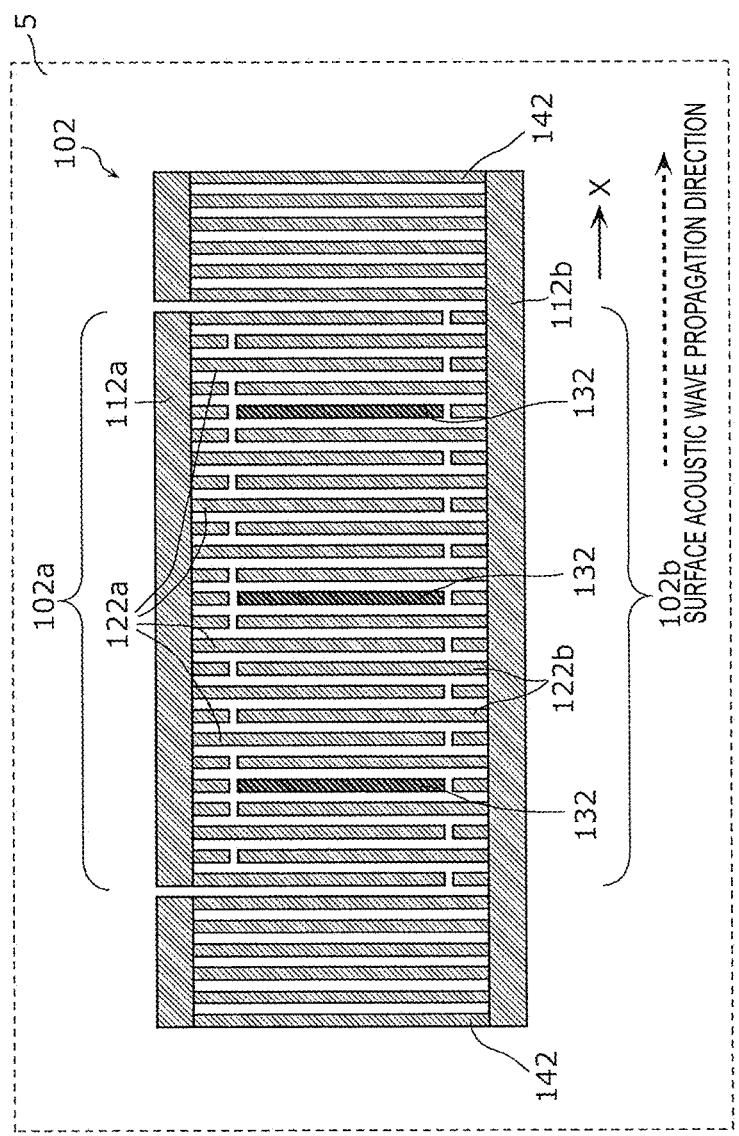
FIG. 5A is a plan view showing electrodes of a subsequent-side acoustic wave resonator of a transmission-side filter of Band A according to a working example.
Figure 5B:
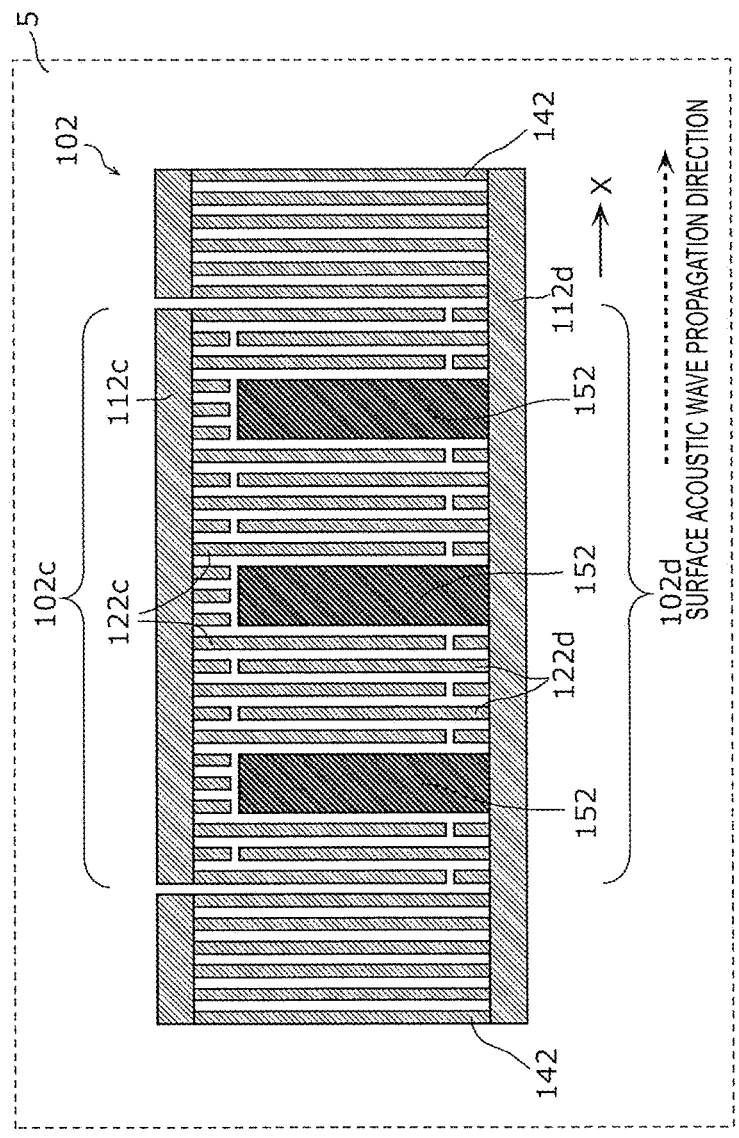
FIG. 5B is a plan view showing electrodes of a subsequent-side acoustic wave resonator of a transmission-side filter of Band A according to a third modification of the first preferred embodiment of the present invention.
Figure 5C:
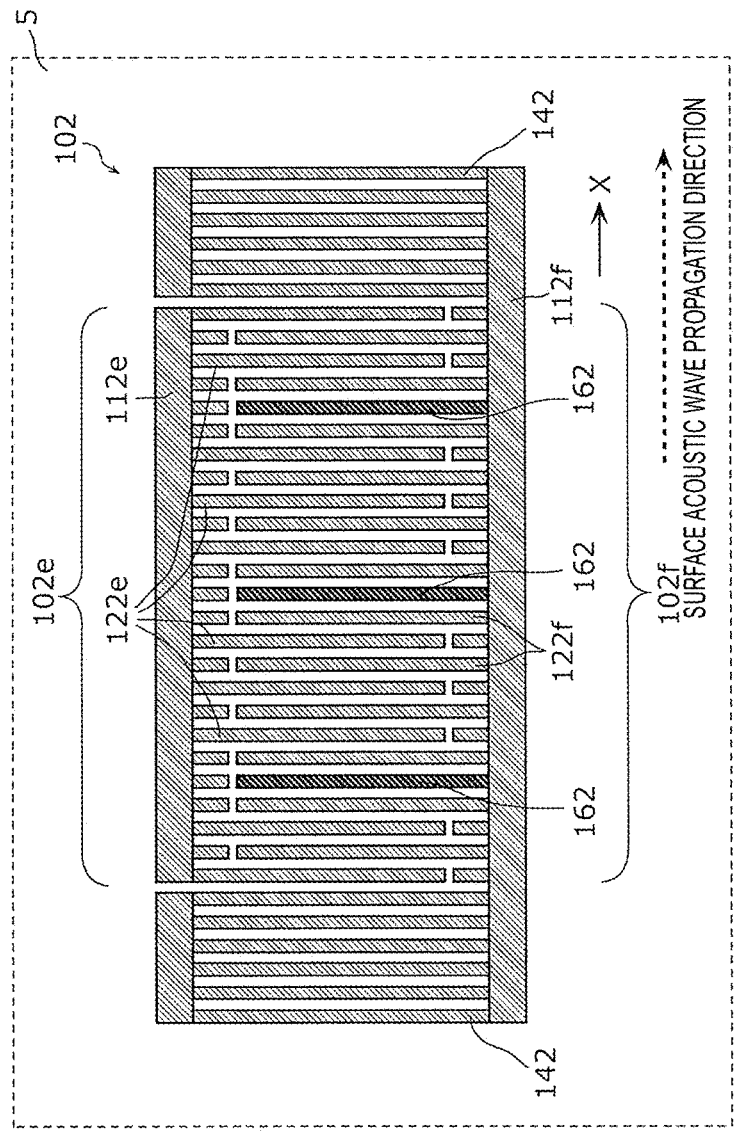
FIG. 5C is a plan view showing electrodes of a subsequent-side acoustic wave resonator of a transmission-side filter of Band A according to a fourth modification of the first preferred embodiment of the present invention.

On the other hand, the IDT electrodes included in the series arm resonators 102, 103 and 104, and the parallel arm resonators 202 and 203 are provided on the substrate 5 and include a thinning electrode as shown in FIGS. 5A to 5C, which is described herein. Accordingly, the resonance band widths of the series arm resonators 102, 103 and 104, and the parallel arm resonators 202 and 203 are smaller than those of the acoustic wave resonators in which a thinning electrode is not provided.

Accordingly, since the resonance band width of the acoustic wave resonance circuit (or the acoustic wave resonator) defining the transmission-side filter 10 becomes relatively small, the band of the transmission-side filter 10 is able to be narrowed.

Features of the transmission-side filter 10 are described below.

(1) The capacitance element C1 is connected in parallel to the series arm resonator 101 (a first series arm resonator: referred to as a first stage-side acoustic wave resonator in some cases), which is connected most proximately to the common terminal 90 among the plurality of series arm resonators 101 to 104, and the IDT electrode of the series arm resonator 101 does not include a thinning electrode.

(2) The capacitance element C2 is connected in parallel to the parallel arm resonator 201 (a first parallel arm resonator: referred to as the first stage-side acoustic wave resonator in some cases), which is connected most proximately to the common terminal 90 among the plurality of parallel arm resonators 201 to 203, and the IDT electrode of the parallel arm resonator 201 does not include a thinning electrode.

(3) The IDT electrodes included in the series arm resonators 102 to 104 (referred to as subsequent-side acoustic wave resonators in some cases) among the plurality of series arm resonators 101 to 104 excluding the series arm resonator 101, include a thinning electrode.

(4) The IDT electrodes included in the parallel arm resonators 202 and 203 (referred to as the subsequent-side acoustic wave resonators in some cases) among the plurality of parallel arm resonators 201 to 203 excluding the parallel arm resonator 201, include a thinning electrode.

According to the features (1) to (4) described above, since the capacitance elements are connected in parallel to, or the thinning electrodes are provided in the acoustic wave resonators defining the transmission-side filter 10, the band of the transmission-side filter 10 is able to be narrowed.

On the other hand, a spurious signal (unwanted wave) is generated outside the pass band (Band ATx) caused by the thinning electrodes provided in the series arm resonators 102 to 104 and the parallel arm resonators 202 to 203 of the transmission-side filter 10. In this case, it is assumed that the spurious signal generation frequency is included in the pass band (Band BTx) of the transmission-side filter 12, for example. In contrast, since the thinning electrodes are not provided in the series arm resonator 101 and the parallel arm resonator 201, which are branches (first stage-side acoustic wave resonators) of the transmission-side filter 10 near the common terminal 90, an increase in return loss in the pass band of the transmission-side filter 12 is able to be significantly reduced or prevented when the transmission-side filter 10 is seen from the common terminal 90. Accordingly, the deterioration in bandpass characteristics of the transmission-side filter 12 caused by the spurious signal generated by the transmission-side filter 10 is able to be significantly reduced or prevented. Accordingly, in the multiplexer 1 in which the plurality of filters is connected to the common terminal 90, low loss of the transmission-side filter is able to be provided while narrowing the band of the transmission-side filter 10.

Note that in the present working example, the capacitance element is connected in parallel to both the series arm resonator 101 and the parallel arm resonator 201 connected most proximately to the common terminal 90. However, the capacitance element may be connected in parallel to only one of the series arm resonator 101 and the parallel arm resonator 201.

Figure 4:
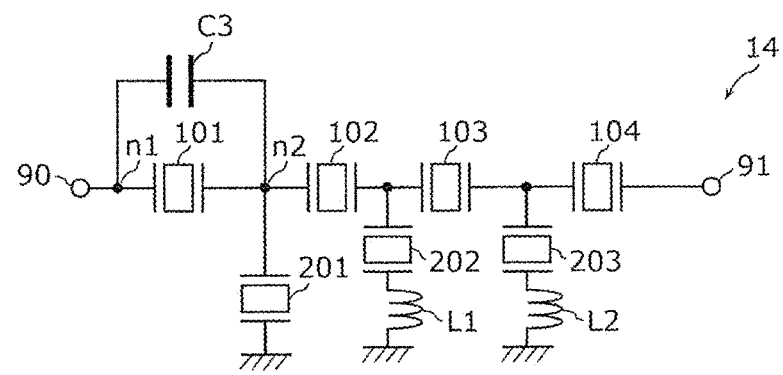
FIG. 4 is a circuit diagram of a transmission-side filter of Band A defining a multiplexer according to a second modification of the first preferred embodiment of the present invention.

FIG. 4 is a circuit diagram of a transmission-side filter 14 defining a multiplexer according to a second modification of the first preferred embodiment. The multiplexer according to the second modification includes the transmission-side filter 14 instead of the transmission-side filter 10 of Band A defining the multiplexer 1 according to the working example.

The transmission-side filter 14 according to the present modification is a first filter that is connected to the common terminal 90 and the transmission input terminal 91 (first input-output terminal), inputs a transmission wave generated by a transmission circuit (for example, an RFIC) via the transmission input terminal 91, and performs filtering on the transmission wave in a transmission pass band of Band A to output the filtered transmission wave to the common terminal 90. As shown in FIG. 4, the transmission-side filter 14 includes the series arm resonators 101, 102, 103 and 104, the parallel arm resonators 201, 202 and 203, a capacitance element C3, and the inductance elements L1 and L2. The transmission-side filter 14 according to the present modification is different from the transmission-side filter 10 according to the working example in that the capacitance element C3 is connected in parallel to only the series arm resonator 101, and a capacitor element is not connected in parallel to the parallel arm resonator 201. Even with the structure described above, low loss of the transmission-side filter 12 is able to be provided while narrowing the band of the transmission-side filter 10, in comparison with a capacitance element being connected in parallel to neither the series arm resonator 101 nor the parallel arm resonator 201.

In the present working example and modification, the thinning electrode is provided in each of the series arm resonators 102 to 104 and the parallel arm resonators 202 and 203. However, the thinning electrode may be provided in at least one of the series arm resonators 102 to 104 and the parallel arm resonators 202 and 203. Accordingly, low loss of the transmission-side filter is able to be provided while narrowing the band of the transmission-side filter 10, in comparison with a thinning electrode not being provided in any of the series arm resonators 102 to 104 and the parallel arm resonators 202 and 203.

In the present working example and modification, no capacitance elements are connected in parallel to the series arm resonators 102 to 104 and the parallel arm resonators 202 and 203. That is, the capacitance element is not connected in parallel to any of the series arm resonators excluding the series arm resonator 101 connected most proximately to the common terminal 90 (subsequent-side acoustic wave resonators), and to any of the parallel arm resonators excluding the parallel arm resonator 201 connected most proximately to the common terminal 90 (subsequent-side acoustic wave resonators).

By connecting the capacitance element in parallel to each of the acoustic wave resonators, the resonance band width of the acoustic wave resonance circuit where the acoustic wave resonator and the capacitance element are connected in parallel may be reduced, but the Q-value of the acoustic wave resonance circuit is lowered caused by the Q-value of the capacitance element, so that the insertion loss of the circuit increases. Accordingly, the location of a parallel capacitance element that narrows the band of the transmission-side filter 10 is limited to the series arm resonator 101 and the parallel arm resonator 201 (first stage-side acoustic wave resonators), and the parallel capacitance element is not provided in each of the series arm resonators excluding the series arm resonator 101 and each of the parallel arm resonators excluding the parallel arm resonator 201 (subsequent-side acoustic wave resonators). Accordingly, in the multiplexer 1 in which the plurality of filters is connected to the common terminal 90, low loss of the transmission-side filter is able to be provided while reducing the loss of the transmission-side filter 10 and narrowing the band of the transmission-side filter 10.

4. Configuration of Thinning Electrode and Capacitance Element

Hereinafter, a thinning electrode and a capacitance element are described with respect to FIG. 5A to FIG. 6.

FIG. 5A is a plan view showing electrodes of a subsequent-side acoustic wave resonator of the transmission-side filter 10 according to the working example. FIG. 5A exemplifies a plan view showing an IDT electrode structure of the series arm resonator 102 as a representative of the resonators (the subsequent-side acoustic wave resonators) excluding both the series arm resonator 101 and the parallel arm resonator 201 connected most proximately to the common terminal 90. Note that the series arm resonator 102 shown in FIG. 5A provides an example of a structure of the subsequent-side acoustic wave resonator, and the number, length, and the like of electrode fingers defining the electrode are not limited thereto.

The series arm resonator 102 includes the substrate 5 having piezoelectricity, comb-shaped electrodes 102a and 102b provided on the substrate 5, and reflectors 142.

As shown in FIG. 5A, the comb-shaped electrode 102a includes a plurality of electrode fingers 122a parallel or substantially parallel to one another, and a busbar electrode 112a connecting the plurality of electrode fingers 122a. The comb-shaped electrode 102b includes a plurality of electrode fingers 122b parallel or substantially parallel to one another, and a busbar electrode 112b connecting the plurality of electrode fingers 122b. The plurality of electrode fingers 122a and the plurality of electrode fingers 122b extend along a direction orthogonal or substantially orthogonal to the acoustic wave propagation direction (X-axis direction). The comb-shaped electrodes 102a and 102b oppose each other, and the plurality of electrode fingers 122a and the plurality of electrode fingers 122b interdigitate each other. Note that the comb-shaped electrode 102a includes dummy electrodes that face one another in a longitudinal direction of the plurality of electrode fingers 122b, but the dummy electrodes may not be provided. Also, the comb-shaped electrode 102b includes dummy electrodes that face one another in a longitudinal direction of the plurality of electrode fingers 122a, but the dummy electrodes may not be provided.

The reflectors 142 each include a plurality of electrode fingers parallel or substantially parallel to one another and a busbar electrode connecting the plurality of electrode fingers, and are provided at both ends of the comb-shaped electrodes 102a and 102b.

The IDT electrode defined by the plurality of electrode fingers 122a and the plurality of electrode fingers 122b, and the busbar electrodes 112a and 112b has a laminated structure including the close contact layer 541 and the main electrode layer 542, as shown in part (b) of FIG. 2A.

Electrode fingers 132 are provided in the IDT electrode of the series arm resonator 102. The electrode fingers 132 are not connected to any of the busbar electrodes 112a and 112b, and are thinning electrodes (floating electrodes) provided in parallel or substantially in parallel to the plurality of electrode fingers 122a and the plurality of electrode fingers 122b at the same or substantially the same pitch. The plurality of electrode fingers 122a and plurality of electrode fingers 122b are provided between adjacent two electrode fingers 132. That is, the pitch of the electrode fingers 132 is larger than the pitch of the plurality of electrode fingers 122a and the plurality of electrode fingers 122b.

Note that a thinning electrode may also include the IDT electrode in which, instead of providing the electrode fingers 132 (floating electrodes), electrode fingers are not provided in portions where the electrode fingers 132 are to be provided.

With the IDT electrode including the electrode fingers 132 as shown in FIG. 5A, the resonance band width of the acoustic wave resonator is able to be significantly reduced. However, a periodic structure by the pitch of the electrode fingers 132 may be provided, separately from a periodic structure of the pitch (IDT electrode pitch) of the plurality of electrode fingers 122a and the plurality of electrode fingers 122b. Accordingly, there is a case where a frequency response corresponding to the periodic structure of the electrode fingers 132, which is different from a frequency response of the main mode corresponding to the periodic structure of the IDT electrode pitch, is generated, and the generated frequency response appears as a spurious signal (unwanted wave) outside the pass band.

FIG. 5B is a plan view showing electrodes of a subsequent-side acoustic wave resonator of the transmission-side filter 10 according to a third modification of the first preferred embodiment. FIG. 5B exemplifies a plan view showing an IDT electrode structure of the series arm resonator 102 as a representative of the acoustic wave resonators (the subsequent-side acoustic wave resonators) excluding both the series arm resonator 101 and the parallel arm resonator 201 connected most proximately to the common terminal 90. Note that the series arm resonator 102 shown in FIG. 5B provides an example of a structure of the subsequent-side acoustic wave resonator, and the number, length, and the like of electrode fingers defining an electrode are not limited thereto.

The series arm resonator 102 includes the substrate 5 having piezoelectricity, comb-shaped electrodes 102c and 102d provided on the substrate 5, and the reflectors 142.

As shown in FIG. 5B, the comb-shaped electrode 102c includes a plurality of electrode fingers 122c parallel or substantially parallel to one another, and a busbar electrode 112c connecting the plurality of electrode fingers 122c. The comb-shaped electrode 102d includes a plurality of electrode fingers 122d parallel or substantially parallel to one another, and a busbar electrode 112d connecting the plurality of electrode fingers 122d. The plurality of electrode fingers 122c and the plurality of electrode fingers 122d extend along a direction orthogonal or substantially orthogonal to the acoustic wave propagation direction (X-axis direction). The comb-shaped electrodes 102c and 102d oppose each other, and the plurality of electrode fingers 122c and the plurality of electrode fingers 122d interdigitate each other. The comb-shaped electrode 102c includes dummy electrodes that face one another a longitudinal direction of the plurality of electrode fingers 122d, but the dummy electrodes may not be provided. The comb-shaped electrode 102d includes dummy electrodes that face one another a longitudinal direction of the plurality of electrode fingers 122c, but the dummy electrodes may not be provided.

The reflectors 142 each include a plurality of electrode fingers parallel or substantially parallel to each other and a busbar electrode connecting the plurality of electrode fingers, and are provided at both ends of the comb-shaped electrodes 102c and 102d.

Note that the IDT electrode defined by the plurality of electrode fingers 122c and the plurality of electrode fingers 122d, and the busbar electrodes 112c and 112d has a laminated structure including the close contact layer 541 and the main electrode layer 542, as shown in FIG. 2A(b).

Electrode fingers 152 are provided in the IDT electrode of the series arm resonator 102. The electrode finger 152 is a thinning electrode (filled electrode) in which the plurality of electrode fingers 122c and plurality of electrode fingers 122d adjacent to each other and spaces between the plurality of electrode fingers adjacent to each other are united into a single electrode finger, the single electrode finger is connected to any one of the busbar electrodes 112c and 112d, and the electrode finger width of the single electrode finger is wider than that of the plurality of electrode fingers 122c and plurality of electrode fingers 122d. Additionally, the plurality of electrode fingers 122c and the plurality of electrode fingers 122d are provided between two electrode fingers 152 adjacent to each other. That is, the pitch of the electrode fingers 152 is larger than the pitch of the plurality of electrode fingers 122c and plurality of electrode fingers 122d. Note that it is sufficient for the electrode finger width of the electrode fingers 152 to be larger than that of the plurality of electrode fingers 122c or 122d.

With the IDT electrode including the electrode fingers 152 as shown in FIG. 5B, the resonance band width of the acoustic wave resonator is able to be significantly reduced. However, a periodic structure by the pitch of the electrode fingers 152 may be provided, separately from a periodic structure of the pitch (IDT electrode pitch) of the plurality of electrode fingers 122c and the plurality of electrode fingers 122d. Accordingly, there is a case where a frequency response corresponding to the periodic structure of the electrode fingers 152, which is different from a frequency response of the main mode corresponding to the periodic structure of the IDT electrode pitch, is generated, and the generated frequency response appears as a spurious signal (unwanted wave) outside the pass band.

FIG. 5C is a plan view showing electrodes of a subsequent-side acoustic wave resonator of the transmission-side filter 10 according to a fourth modification of the first preferred embodiment. FIG. 5C exemplifies a plan view showing an IDT electrode structure of the series arm resonator 102 as a representative of the acoustic wave resonators (the subsequent-side acoustic wave resonators) excluding both the series arm resonator 101 and the parallel arm resonator 201 connected most proximately to the common terminal 90. Note that the series arm resonator 102 shown in FIG. 5C is provided as an example of a structure of the subsequent-side acoustic wave resonator, and the number, length, and the like of electrode fingers defining the electrode are not limited thereto.

The series arm resonator 102 includes the substrate 5 having piezoelectricity, comb-shaped electrodes 102e and 102f provided on the substrate 5, and reflectors 142.

As shown in FIG. 5C, the comb-shaped electrode 102e includes a plurality of electrode fingers 122e parallel or substantially parallel to one another, and a busbar electrode 112e connecting the plurality of electrode fingers 122e. The comb-shaped electrode 102f includes a plurality of electrode fingers 122f parallel or substantially parallel to one another, and a busbar electrode 112f connecting the plurality of electrode fingers 122f. The plurality of electrode fingers 122e and the plurality of electrode fingers 122f extend along a direction orthogonal or substantially orthogonal to the acoustic wave propagation direction (X-axis direction). The comb-shaped electrodes 102e and 102f oppose each other, and the plurality of electrode fingers 122e and the plurality of electrode fingers 122f interdigitate each other. The comb-shaped electrode 102e includes dummy electrodes that face one another in a longitudinal direction of the plurality of electrode fingers 122f, but the dummy electrodes may not be provided. The comb-shaped electrode 102f includes dummy electrodes that face one another in a longitudinal direction of the plurality of electrode fingers 122e, but the dummy electrodes may not be provided.

The reflectors 142 each include a plurality of electrode fingers parallel or substantially parallel to one another and a busbar electrode connecting the plurality of electrode fingers, and are provided at both ends of the comb-shaped electrodes 102e and 102f.

Note that the IDT electrode defined by the plurality of electrode fingers 122e and the plurality of electrode fingers 122f, and the busbar electrodes 112e and 112f has a laminated structure including the close contact layer 541 and the main electrode layer 542, as shown in FIG. 2A(b).

Electrode fingers 162 are provided in the IDT electrode of the series arm resonator 102. The electrode finger 162 is connected to the same busbar electrode as the busbar electrode to which the electrode fingers adjacent to the electrode finger 162 are connected, and is a thinning electrode provided in parallel or substantially in parallel to the plurality of electrode fingers 122e and plurality of electrode fingers 122f and at the same or substantially the same pitch. Also, the plurality of electrode fingers 122e and the plurality of electrode fingers 122f are provided between adjacent two electrode fingers 162. That is, the pitch of the electrode fingers 162 is larger than the pitch of the plurality of electrode fingers 122e and the plurality of electrode fingers 122f.

With the IDT electrode including the electrode fingers 162 as shown in FIG. 5C, the resonance band width of the acoustic wave resonator is able to be significantly reduced. However, a periodic structure by the pitch of the electrode fingers 162 is provided, separately from a periodic structure of the pitch (IDT electrode pitch) of the plurality of electrode fingers 122e and the plurality of electrode fingers 122f. Accordingly, there is a case where a frequency response corresponding to the periodic structure of the electrode fingers 162, which is different from a frequency response of the main mode corresponding to the periodic structure of the IDT electrode pitch, is generated, and the generated frequency response appears as a spurious signal (unwanted wave) outside the pass band.

Note that the IDT electrodes shown in FIGS. 5A to 5C may each be a tilting IDT electrode in which, in addition to the thinning electrode being included, the busbar electrode is tilted with respect to the acoustic wave propagation direction.

Additionally, three electrode fingers 132 (floating electrodes) shown in FIG. 5A include the electrode finger connected to the busbar electrode 112a in the original periodic configuration and the electrode finger connected to the busbar electrode 112b in the original periodic configuration alternately provided in the X direction. On the other hand, the structure and location of the plurality of electrode fingers 132 is not limited thereto, and only the electrode fingers connected to the busbar electrode 112a in the original periodic structure and location may be used as the plurality of electrode fingers 132, or only the electrode fingers connected to the busbar electrode 112b in the original periodic structure and location may be used as the plurality of electrode fingers 132.

All of the three electrode fingers 152 (filled electrodes) shown in FIG. 5B are connected to the busbar electrode 112d. On the other hand, the structure and location of the plurality of electrode fingers 152 is not limited thereto. All of the plurality of electrode fingers 152 may be connected to the busbar electrodes 112c, or the electrode finger 152 connected to the busbar electrodes 112d and the electrode finger 152 connected to the busbar electrodes 112c may be alternately provided in the X direction.

All of the three electrode fingers 162 shown in FIG. 5C are connected to the busbar electrode 112f. On the other hand, the structure and location of the plurality of electrode fingers 162 is not limited thereto. All the plurality of electrode fingers 162 may be connected to the busbar electrodes 112e, or the electrode finger 162 connected to the busbar electrodes 112f and the electrode finger 162 connected to the busbar electrodes 112e may be alternately provided in the X direction.

Figure 6:
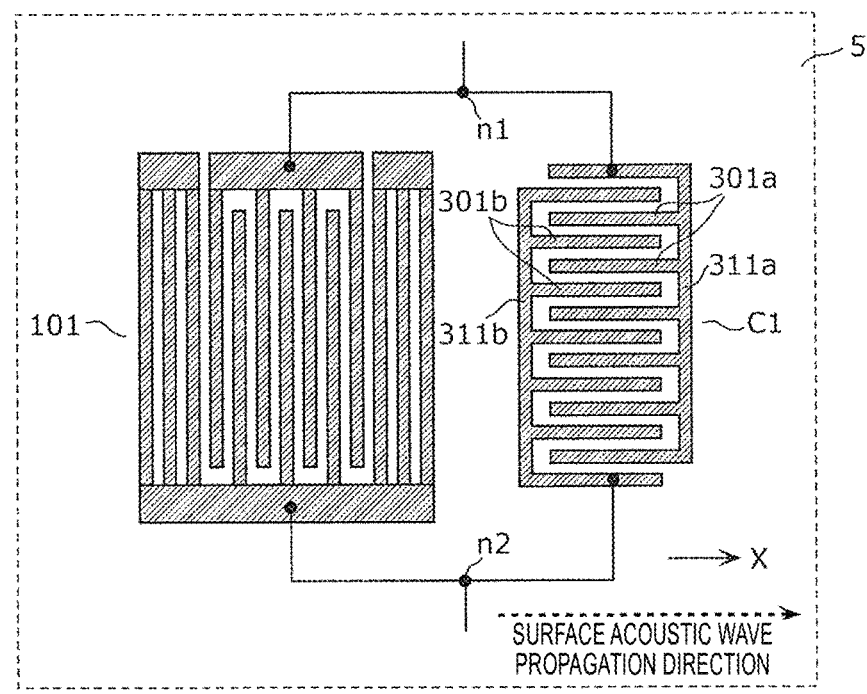
FIG. 6 is a plan view showing electrodes of a first stage-side acoustic wave resonator of a transmission-side filter of Band A according to a working example.

FIG. 6 is a plan view showing an example of electrodes of a first stage-side acoustic wave resonator of the transmission-side filter 10 according to the working example. FIG. 6 exemplifies a plan view showing an electrode structure of a series arm resonator 101 and the capacitance element C1 as a representative of the series arm resonator 101 and the parallel arm resonator 201 connected most proximately to the common terminal 90. As shown in FIG. 6, the capacitance element C1 may include a comb-tooth electrode provided on the substrate 5. Although not shown, the capacitance element C2 may include a comb-tooth electrode provided on the substrate 5. Accordingly, since a series arm circuit in which the capacitance element C1 and the series arm resonator 101 are connected in parallel and a parallel arm circuit in which the capacitance element C2 and the parallel arm resonator 201 are connected in parallel may be significantly reduced in size, the multiplexer 1 is able to be significantly reduced in size.

As shown in FIG. 6, the comb-tooth electrode of the capacitance element C1 includes a plurality of electrode fingers 301a and the plurality of electrode fingers 301b that are parallel or substantially parallel to each other and to interdigitate each other, and a pair of busbar electrodes 311a and 311b oppose each other across the plurality of electrode fingers 301a and the plurality of electrode fingers 301b. The plurality of electrode fingers 301a are connected to the busbar electrode 311a, and the plurality of electrode fingers 301b are connected to the busbar electrode 311b.

As shown in FIG. 6, the plurality of electrode fingers 301a and the plurality of electrode fingers 301b may be provided along a propagation direction of the surface acoustic wave in the IDT electrode of the series arm resonator 101, and may also be provided periodically along a direction orthogonal or substantially orthogonal to the propagation direction.

Accordingly, a situation in which an unwanted wave generated in the capacitance element C1 interferes with the surface acoustic wave propagating through the IDT electrode of the series arm resonator 101 is able to be significantly reduced or prevented.

5. Bandpass Characteristics and Reflection Characteristics of Multiplexer 1

Bandpass characteristics and reflection characteristics of the multiplexer 1 according to the working example are compared with bandpass characteristics and reflection characteristics of a multiplexer according to a comparative example to describe the effects exhibited by the multiplexer 1. In the multiplexer 1 according to the working example, Band A, which is a pass band of the transmission-side filter 10 and the reception-side filter 11, is applied to Band 30 (transmission band: about 2305 MHz to about 2315 MHz, reception band: about 2350 MHz to about 2360 MHz) of Long Term Evolution (LTE), and Band B, which is a pass band of the transmission-side filter 12 and the reception-side filter 13, is applied to Band 25 (transmission band: about 1850 MHz to about 1915 MHz, reception band: about 1930 MHz to about 1995 MHz) of LTE. That is, the transmission-side filter 10 and the reception-side filter 11 are applied to a duplexer of Band 30 (first duplexer), and the transmission-side filter 12 and the reception-side filter 13 are applied to a duplexer of Band 25 (second duplexer). That is, the multiplexer 1 according to the working example is applied as a quadplexer of Band 30 and Band 25.

Note that in the multiplexer according to the comparative example, in comparison with the multiplexer according to the working example, the structures and features of the transmission-side filter 12 and the reception-side filters 11 and 13 are the same as or similar to those of the working example, and only the structures and features of a transmission-side filter 510 for Band A is different.

Figure 7:
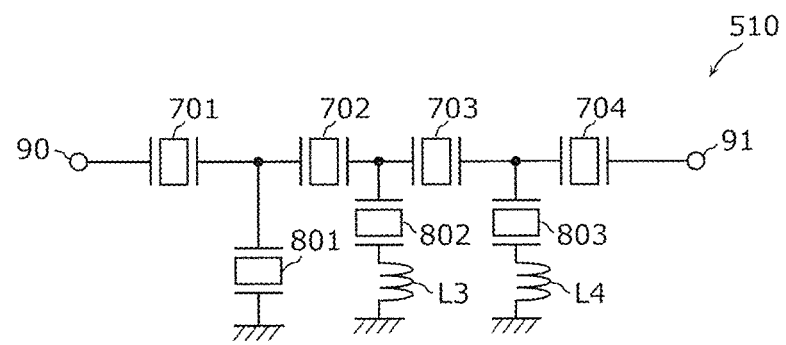
FIG. 7 is a circuit diagram of a transmission-side filter of Band A defining a multiplexer according to a comparative example.

FIG. 7 is a circuit diagram of the transmission-side filter 510 of Band A defining the multiplexer according to the comparative example. As shown in FIG. 7, the transmission-side filter 510 includes series arm resonators 701, 702, 703 and 704, parallel arm resonators 801, 802 and 803, and inductance elements L3 and L4. The series arm resonators 701 to 704 are provided on a path connecting the common terminal 90 and the transmission input terminal 91, and are connected in series to one another. The parallel arm resonators 801 to 803 are provided between nodes on the above-described path and a reference terminal (ground). A capacitance element is not connected in parallel to any of the series arm resonator 701 and the parallel arm resonator 801 of the transmission-side filter 510. In each of the series arm resonators 701 to 704 and the parallel arm resonators 801 to 803, a thinning electrode is provided.

Table 1 shows electrode parameters of each acoustic wave resonator of the transmission-side filter 10 according to the working example.

TABLE 1

| | Transmission-side filter 10 (working example) | | | |
|---|---|---|---|---|
| | Series arm resonator 101 | Series arm resonator 102 | Series arm resonator 103 | Series arm resonator 104 |
| Wavelength λ (μm) | 1.6247 | 1.6915 | 1.7010 | 1.6912 |
| Intersecting width (μm) | 33.2 | 24.5 | 34.0 | 27.9 |
| Number of pairs (pairs) | 165 | 62 | 169 | 62 |
| Electrode duty | 0.5 | 0.5 | 0.5 | 0.5 |
| Number of segments | 3 | 4 | 1 | 3 |

| | Parallel arm resonator 201 | Parallel arm resonator 202 | Parallel arm resonator 203 |
|---|---|---|---|
| Wavelength λ (μm) | 1.6832 | 1.7328 | 1.7290 |
| Intersecting width (μm) | 32.2 | 34.1 | 68.6 |
| Number of pairs (pairs) | 80 | 62 | 197 |
| Electrode duty | 0.5 | 0.5 | 0.5 |
| Number of segments | 3 | 1 | 1 |

Note that in Table 1, "number of segments" refers to the number of series segments in a series arm resonator, and the number of parallel segments in a parallel arm resonator.

In the transmission-side filter 10 according to the working example, in addition to the acoustic wave resonators shown in Table 1, capacitance elements C1 (about 0.63 pF) and C2 (about 0.28 pF) and inductance elements L1 (about 0.65 nH) and L2 (about 0.33 nH) are added. Further, in the transmission-side filter 10 according to the working example, a thinning electrode is provided in the IDT electrode of each of the series arm resonators 102 to 104 and the parallel arm resonators 202 to 203, with respect to the electrode parameters of the acoustic wave resonators shown in Table 1.

On the other hand, in the transmission-side filter 510 according to the comparative example, electrode parameters of the series arm resonators 701 to 704 and the parallel arm resonators 801 to 803 are the same as or similar to the electrode parameters of the series arm resonators 101 to 104 and the parallel arm resonators 201 to 203 shown in Table 1, respectively. Also, an inductance value of the inductance element L3 is equal or substantially equal to an inductance value of the inductance element L1, and an inductance value of the inductance element L4 is equal or substantially equal to an inductance value of the inductance element L2. A thinning electrode is provided in the IDT electrode of each of the acoustic wave resonators of the series arm resonators 701 to 704 and the parallel arm resonators 801 to 803.

Figure 8A:
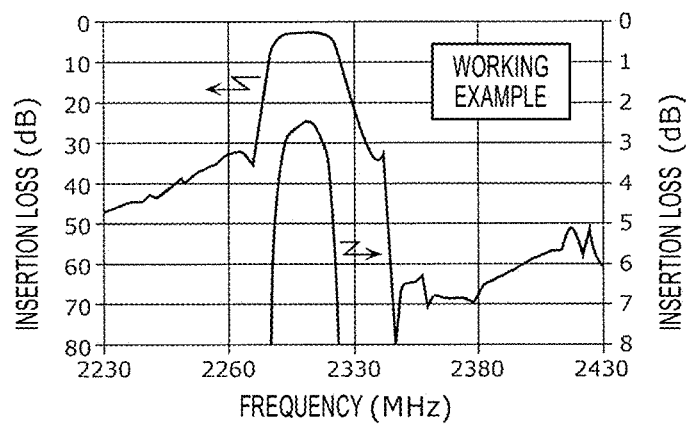
FIG. 8A is a graph showing bandpass characteristics of a transmission-side filter of Band A defining a multiplexer according to a working example.
Figure 8B:
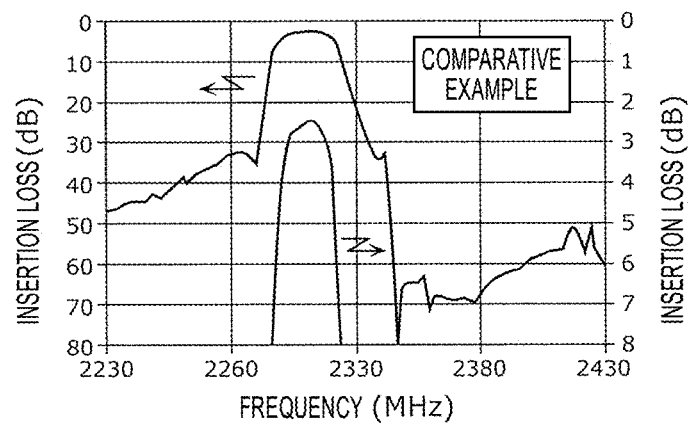
FIG. 8B is a graph showing bandpass characteristics of a transmission-side filter of Band A defining a multiplexer according to a comparative example.

FIG. 8A is a graph showing bandpass characteristics of the transmission-side filter 10 defining the multiplexer 1 according to the working example. FIG. 8B is a graph showing bandpass characteristics of the transmission-side filter 510 defining the multiplexer according to the comparative example. When the graphs of FIGS. 8A and 8B are compared with each other, in the transmission band of Band 30 (about 2305 MHz to about 2315 MHz), the insertion loss of the transmission-side filter 10 (maximum insertion loss: about 2.72 dB) and insertion loss of the transmission-side filter 510 (maximum insertion loss: about 2.70 dB) are substantially equal to each other. From this, it is understood that, in the transmission-side filter 10 according to the working example, even when capacitance elements are connected in parallel in place of the thinning electrodes in the series arm resonator 101 and the parallel arm resonator 201, a narrowed band is able to be provided without worsening the insertion loss.

Figure 9A:
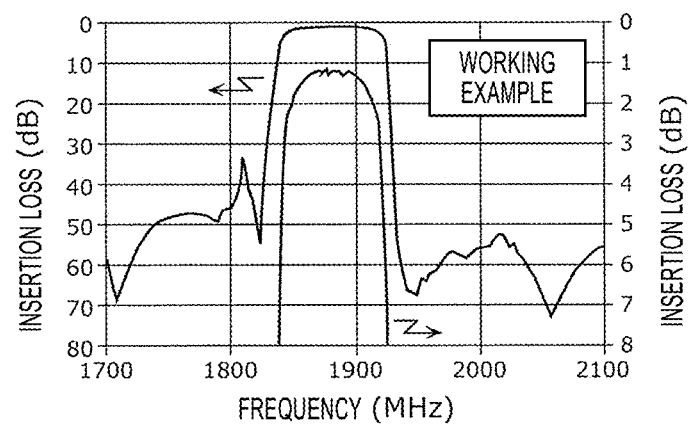
FIG. 9A is a graph showing bandpass characteristics of a transmission-side filter of Band B defining a multiplexer according to a working example.
Figure 9B:
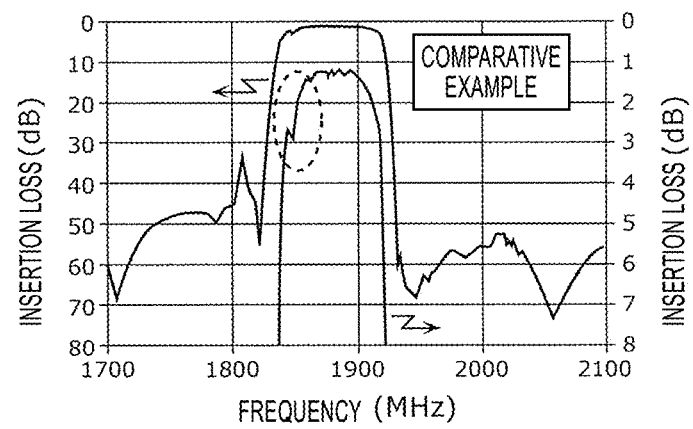
FIG. 9B is a graph showing bandpass characteristics of a transmission-side filter of Band B defining a multiplexer according to a comparative example.

FIG. 9A is a graph showing bandpass characteristics of the transmission-side filter 12 for Band 25 defining the multiplexer 1 according to the working example. FIG. 9B is a graph showing bandpass characteristics of the transmission-side filter for Band 25 defining the multiplexer according to the comparative example. When the graphs of FIGS. 9A and 9B are compared with each other, it is observed that a ripple is generated (a broken-line portion in FIG. 9B) in the transmission band of Band 25 (about 1850 MHz to about 1915 MHz) in the comparative example. Because of this, the insertion loss in the pass band of the transmission-side filter 12 according to the comparative example is larger than the insertion loss in the pass band of the transmission-side filter 12 according to the working example. That is, in the comparative example, since the thinning electrodes are provided in the series arm resonator 101 and the parallel arm resonator 201 of the transmission-side filter 510, the insertion loss of the transmission-side filter 12 is worsened.

Figure 10A:
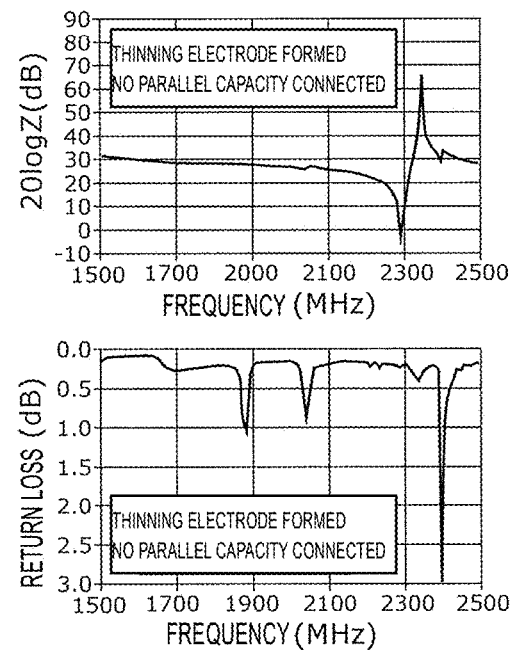
FIG. 10A includes graphs showing impedance characteristics and reflection characteristics, respectively, of an acoustic wave resonator including a thinning electrode and having no capacitance element connected in parallel.
Figure 10B:
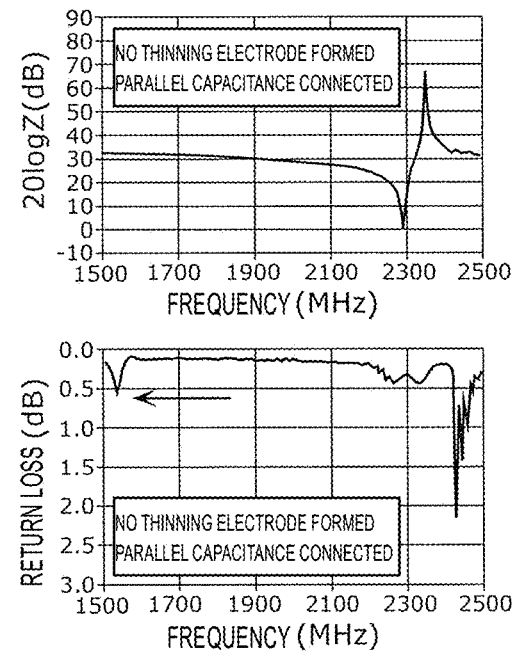
FIG. 10B includes graphs showing impedance characteristics and reflection characteristics, respectively, of an acoustic wave resonance circuit including no thinning electrode and having a capacitance element connected in parallel.

FIG. 10A includes graphs showing impedance characteristics and reflection characteristics, respectively, of an acoustic wave resonator (series arm resonator 701 according to the comparative example) including a thinning electrode and to which a capacitance element is not connected in parallel. FIG. 10B includes graphs showing impedance characteristics and reflection characteristics, respectively, of an acoustic wave resonance circuit (series arm circuit in which the series arm resonator 101 and the capacitance element C1 according to the working example are connected in parallel) without a thinning electrode and to which the capacitance element connected in parallel. The acoustic wave resonator having the characteristics shown in FIG. 10A (the series arm resonator 701) and the acoustic wave resonance circuit having the characteristics shown in FIG. 10B (the series arm circuit in which the series arm resonator 101 and the capacitance element C1 are connected in parallel) both reduce the resonance band width.

In FIG. 10A, in the series arm resonator 701 according to the comparative example, since the thinning electrode is provided, a point where the reflection loss is increased (a point where a spurious signal is generated: about 1800 MHz to about 2100 MHz in FIG. 10A) appears, and the frequency thereof is included in the transmission band of Band 25 (about 1850 MHz to about 1915 MHz). When a thinning electrode is provided in a portion of the IDT electrode to provide a narrow band filter, a periodic structure by the thinning electrode is provided separately from the periodic structure of the IDT electrode pitch. Accordingly, a frequency response corresponding to the periodic structure by the thinning electrode, which is different from a frequency response of the main mode corresponding to the periodic structure of the IDT electrode pitch, is generated, and the generated frequency response appears as a spurious signal (unwanted wave) outside the pass band.

On the other hand, in FIG. 10B, in the series arm circuit in which the series arm resonator 101 and the capacitance element C1 according to the working example are connected in parallel, a point where the return loss is increased (a point where a spurious signal is generated: a low frequency side relative to about 1600 MHz in FIG. 10B) caused by the comb-tooth capacitance of the capacitance element C1 appears, but it is easy to shift the spurious signal appearing frequency; for example, the frequency is shifted toward a lower frequency side by, for example, adjusting the pitch of the comb-tooth capacitance or the like. However, when the capacitance element C1 is connected in parallel to the series arm resonator 101, the Q-value of the series arm circuit in which the series arm resonator 101 and the capacitance element C1 are connected in parallel is adversely affected by a low Q-value of the capacitance element C1 defined by a comb-tooth electrode or the like.

Figure 11:
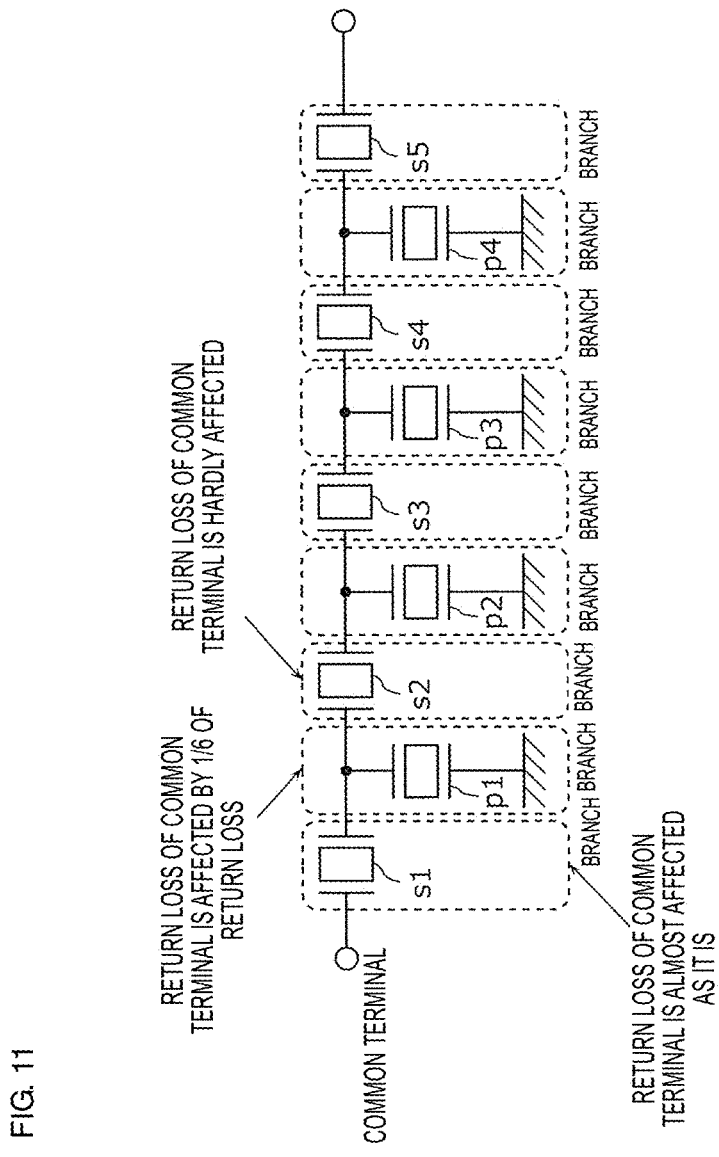
FIG. 11 is a diagram describing a relationship between a branch of a ladder acoustic wave filter and reflection characteristics thereof.

FIG. 11 is a diagram describing a relationship between a branch of a ladder acoustic wave filter and reflection characteristics thereof. FIG. 11 shows a ladder acoustic wave filter including five series arm resonators s1 to s5 and four parallel arm resonators p1 to p4. When the reflection characteristics seen from a common terminal are evaluated, in return loss seen from the common terminal, the return loss of the branch which is closest to the common terminal (the series arm resonator s1 in FIG. 11), is almost affected as it is, the return loss of the branch which is second closest to the common terminal (the parallel arm resonator p1 in FIG. 11), is affected by substantially one sixth of the return loss, and the return loss of the branch which is third closest to the common terminal (the series arm resonator s2 in FIG. 11), is hardly affected. The return loss seen from the common terminal is hardly affected by the return loss of the branches including the fourth closest branch and the subsequent branches (the parallel arm resonators p2, p3 and p4, and the series arm resonators s3, s4 and s5 in FIG. 11).

Note that the term "branch" described in the present specification is used to represent one unit of a series arm resonator or a parallel arm resonator that defines a ladder filter. When a plurality of series arm resonators are continuously connected, in a case where a node to be connected to the parallel arm resonator is not provided between the plurality of series arm resonators, the plurality of series arm resonators are defined as one branch. When a plurality of nodes to be connected to the plurality of parallel arm resonators respectively is continuously connected, in a case where a series arm resonator is not provided between the plurality of nodes, the plurality of parallel arm resonators are defined as one branch.

When this is applied to the multiplexer 1 according to the working example, the acoustic wave resonators with the thinning electrodes provided therein whose acoustic wave resonance circuits, which may cause spurious signals to appear, affect the return loss seen from the common terminal 90, are the series arm resonator 101, which is the first branch, and the parallel arm resonator 201, which is the second branch. On the other hand, even when the thinning electrodes are provided in the acoustic wave resonators as the third and subsequent branches, spurious signals generated due to the thinning electrode formation hardly affect the return loss seen from the common terminal 90. In consideration of balance of the above characteristics and the characteristics that the insertion loss is worsened in the acoustic wave resonance circuit in which the capacitance element is connected in parallel, the multiplexer 1 according to the working example includes the following structure and feature. In the transmission-side filter 10, the capacitance element is connected in parallel to each of the series arm resonator 101 as the first branch and the parallel arm resonator 201 as the second branch, and the thinning electrodes are provided in the other acoustic wave resonators.

Accordingly, an increase in insertion loss of the transmission-side filter 12 caused by spurious signals (unwanted waves) generated in the subsequent-side acoustic wave resonator is able to be significantly reduced or prevented while narrowing the band of the transmission-side filter 10.

As in the present working example, a capacitance element is preferably not connected in parallel to the subsequent-side acoustic wave resonator, for example, because the Q-value is lowered to increase the insertion loss of the filter as the number of acoustic wave resonance circuits having the capacitance elements connected in parallel is larger. That is, as in the present working example, by not connecting the capacitance element in parallel to the subsequent-side acoustic wave resonator, an increase in the insertion loss of the transmission-side filter 12 caused by spurious signals (unwanted waves) generated in the subsequent-side acoustic wave resonator is able to be significantly reduced or prevented while reducing the loss of the transmission-side filter 10 and narrowing the band of the transmission-side filter 10.

Note that the multiplexer 1 according to the present working example may be a hexaplexer in which, for example, a duplexer of Band 66 (transmission band: about 1710 MHz to about 1780 MHz, reception band: about 2110 MHz to about 2200 MHz) is added to a quadplexer of Band 30 and Band 25. Since the reception band of Band 66 (about 2110 MHz to about 2200 MHz) is located in a vicinity of a lower frequency side of the transmission band of Band 30 (about 2305 MHz to about 2315 MHz), attenuation in a vicinity of the lower frequency side of the transmission-side filter 10 for Band 30 is preferably provided, for example. Accordingly, the transmission-side filter 10 has a narrower band to ensure the attenuation in the reception band of Band 66. Therefore, in a case of providing the above-described hexaplexer, the first preferred embodiment is able to provide both a narrower band of the transmission-side filter 10 for Band 30 and a decrease in loss of the transmission-side filter 12 for Band 25.

Second Preferred Embodiment

The multiplexer 1 according to the first preferred embodiment may also be applied to a high frequency front-end circuit, and further to a communication apparatus including the high frequency front-end circuit. In a present preferred embodiment of the present invention, a high frequency front-end circuit and a communication apparatus are described.

Figure 12:
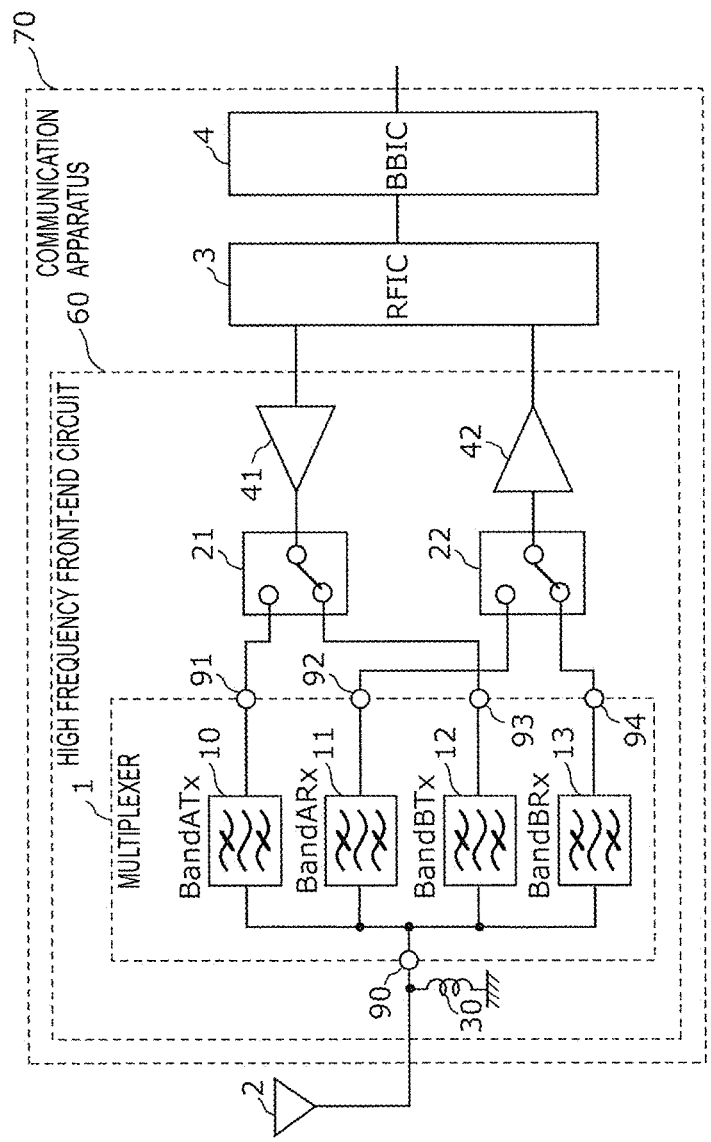
FIG. 12 is a diagram of a communication apparatus according to a second preferred embodiment of the present invention.

FIG. 12 is a diagram of a communication apparatus 70 according to the second preferred embodiment. The communication apparatus 70 includes a high frequency front-end circuit 60, an RF signal processing circuit 3, and a baseband signal processing circuit 4. In FIG. 12, an antenna element 2 connected to the communication apparatus 70 is also shown.

The high frequency front-end circuit 60 includes the multiplexer 1 according to a preferred embodiment of the present invention, an inductance element 30, a reception-side switch 22, a transmission-side switch 21, a low-noise amplifier circuit 42, and a power amplifier circuit 41.

The transmission-side switch 21 is a switch circuit including two selection terminals individually connected to transmission input terminals 91 and 93 of the multiplexer 1, and a common terminal connected to the power amplifier circuit 41.

The reception-side switch 22 is a switch circuit including two selection terminals individually connected to reception output terminals 92 and 94 of the multiplexer 1, and a common terminal connected to the low-noise amplifier circuit 42.

Each of the transmission-side switch 21 and the reception-side switch 22 connects the common terminal and a signal path corresponding to a predetermined band in accordance with a control signal from a controller (not shown), and preferably includes, for example, a single pole double throw (SPDT) type switch. The number of selection terminals connected to the common terminal is not limited to one, and a plurality of selection terminals may be connected thereto. That is, the high frequency front-end circuit 60 may support carrier aggregation.

The power amplifier circuit 41 is a transmission amplifier circuit that amplifies a high frequency signal (in this case, a high frequency transmission signal) outputted from the RF signal processing circuit 3 and output the amplified high frequency signal to the antenna element 2 via the transmission-side switch 21 and the multiplexer 1.

The low-noise amplifier circuit 42 is a reception amplifier circuit that amplifies a high frequency signal (in this case, a high frequency reception signal) having passed through the antenna element 2, the multiplexer 1 and the reception-side switch 22, and output the amplified high frequency signal to the RF signal processing circuit 3.

Note that the power amplifier circuit may include amplification elements individually corresponding to Band A and Band B. In this case, the transmission-side switch 21 may not be provided. The low-noise amplifier circuit may include amplification elements individually corresponding to Band A and Band B, respectively. In this case, the reception-side switch 22 may not be provided.

The RF signal processing circuit 3 performs signal processing on a high frequency reception signal inputted from the antenna element 2 via the low-noise amplifier circuit 42 by down-conversion or the like, and outputs a reception signal generated by the signal processing to the baseband signal processing circuit 4. In addition, the RF signal processing circuit 3 performs signal processing on a transmission signal inputted from the baseband signal processing circuit 4 by up-conversion or the like, and outputs a high frequency transmission signal generated by the signal processing to the power amplifier circuit 41. The RF signal processing circuit 3 is preferably, for example, an RFIC.

The signal processed by the baseband signal processing circuit 4 is used, for example, as an image signal for image display, or as a sound signal for conversation.

Note that the communication apparatus 70 may not include the baseband signal processing circuit (BBIC) 4 in accordance with a processing scheme of the high frequency signal.

Note that the high frequency front-end circuit 60 may include another circuit element between each of the elements described above.

According to the high frequency front-end circuit 60 and the communication apparatus 70 provided as described above, since the multiplexer 1 according to the first preferred embodiment described above is provided, low loss of the transmission-side filter 12 is able to be provided while narrowing the band of the transmission-side filter 10.

OTHER MODIFICATIONS

The multiplexer 1 according to the first preferred embodiment, and the high frequency front-end circuit 60 and the communication apparatus 70 according to the second preferred embodiment have been described while referring to the preferred embodiments. However, the present invention is not limited to the above-described preferred embodiments. For example, aspects in which the following modifications are applied to the above-described preferred embodiments may also be included in the present invention.

For example, in the above description, a quadplexer applied to Band A and Band B is exemplified and explained as the multiplexer 1. However, the present invention may also be applied to, for example, a triplexer in which an antenna connection terminal is shared by three filters, or a hexaplexer in which three duplexers are common-connected at a common terminal. That is, it is sufficient for the multiplexer to include at least two filters.

The multiplexer according to the preferred embodiments of the present invention is not limited to both a transmission-side filter and a reception-side filter, and may include only a plurality of transmission-side filters or only a plurality of reception-side filters.

Also, in the first preferred embodiment, it is described that the transmission-side filter 10 applied to Band A corresponds to the first filter, and the transmission-side filter 12 corresponds to the second filter. That is, in the first preferred embodiment, the first filter and the second filter are both the transmission-side filters. However, without being limited to the usage for the first and second filters or the like, the present invention may be applied to any multiplexer as long as the frequency of the unwanted wave generated by the narrow-band first filter is located within the pass band of the second filter.

Preferred embodiments of the present invention may be widely applied to communication equipment, for example, mobile phones, as a low-loss multiplexer, a high frequency front-end circuit, a communication apparatus, or the like that is applicable to multi-band and multi-mode frequency standards.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A multiplexer comprising:
 a common terminal, a first input-output terminal, and a second input-output terminal;
 a first filter electrically connected to the common terminal and the first input-out terminal; and
 a second filter having a pass band different from a pass band of the first filter, and electrically connected to the common terminal and the second input-output terminal; wherein
 the first filter includes a plurality of series arm resonators provided on a path connecting the common terminal and the first input-output terminal, and a plurality of parallel arm resonators provided between the path and ground;
 each of the plurality of series arm resonators and the plurality of parallel arm resonators is an acoustic wave resonator including an interdigital transducer (IDT) electrode provided on a substrate having piezoelectricity;
 a capacitance element is electrically connected in parallel to at least one of a first series arm resonator, which is a series arm resonator connected most proximately to the common terminal among the plurality of series arm resonators, and a first parallel arm resonator, which is a parallel arm resonator connected most proximately to the common terminal among the plurality of parallel arm resonators, and the IDT electrode included in the at least one of the first series arm resonator and the first parallel arm resonator does not include a thinning electrode; and the IDT electrode included in at least one of the series arm resonators excluding the first series arm resonator among the plurality of series arm resonators and the parallel arm resonators excluding the first parallel arm resonator among the plurality of parallel arm resonators, includes a thinning electrode.

2. The multiplexer according to claim 1, wherein: no capacitance element is connected in parallel to each of the series arm resonators excluding the first series arm resonator among the plurality of series arm resonators, and each of the parallel arm resonators excluding the first parallel arm resonator among the plurality of parallel arm resonators.

3. The multiplexer according to claim 1, wherein each of the series arm resonators excluding the first series arm resonator among the plurality of series arm resonators and each of the parallel arm resonators excluding the first parallel arm resonator among the plurality of parallel arm resonators, includes a thinning electrode.

4. The multiplexer according to claim 1, wherein the capacitance element includes a comb-tooth electrode provided on the substrate.

5. The multiplexer according to claim 4, wherein
the comb-tooth electrode includes a plurality of electrode fingers provided in parallel or substantially in parallel to one another and a pair of busbars that oppose each other across the plurality of electrode fingers; and
the plurality of electrode fingers are provided along a propagation direction of an acoustic wave in the IDT electrode, and are also provided periodically along a direction orthogonal or substantially orthogonal to the propagation direction.

6. The multiplexer according to claim 1, wherein the substrate includes a piezoelectric film with the IDT electrode provided on one surface of the piezoelectric film, a high acoustic velocity support substrate through which a bulk wave propagates at a higher acoustic velocity than an acoustic velocity of the acoustic wave that propagates through the piezoelectric film, and a low acoustic velocity film which is provided between the high acoustic velocity support substrate and the piezoelectric film, and through which a bulk wave propagates at a lower acoustic velocity than an acoustic velocity of a bulk wave that propagates through the piezoelectric film.

7. The multiplexer according to claim 1, wherein the multiplexer includes a first duplexer provided with two filters including the first filter, and a second duplexer provided with two filters including the second filter.

8. The multiplexer according to claim 1, wherein a pass band of the first filter is an uplink frequency band in Band 30 of Long Term Evolution (LTE), and a pass band of the second filter is an uplink frequency band in Band 25 of the LTE.

9. A high frequency front-end circuit comprising:
multiplexer according to claim 1; and
an amplifier circuit electrically connected to the multiplexer.

10. A communication apparatus comprising:
an RF signal processing circuit to process a high frequency signal transmitted and received by an antenna element; and
the frequency front-end circuit according to claim 9 to transmit the high frequency signal between the antenna element and the RF signal processing circuit.

11. The communication apparatus according to claim 10, wherein the first filter and the second filter are each a filter for the high frequency signal.

12. The multiplexer according to claim 1, wherein
the IDT electrode is defined by a plurality of electrode fingers provided in parallel or substantially in parallel to one another and a pair of busbars that oppose each other across the plurality of electrode fingers; and
the plurality of electrode fingers are provided along a propagation direction of an acoustic wave in the IDT electrode.

13. The multiplexer according to claim 12, wherein the plurality of electrode fingers and the pair of busbars include a laminated structure including a close contact layer and a main electrode layer.

14. The multiplexer according to claim 6, wherein the piezoelectric film includes a 50° Y-cut X-propagation $LiTaO_3$ piezoelectric single crystal or piezoelectric ceramics.

15. The multiplexer according to claim 6, wherein
the high acoustic velocity support substrate is a silicon substrate; and
low acoustic velocity film includes silicon dioxide.

16. The multiplexer according to claim 1, wherein the first filter includes a first inductance element electrically connected between a first one of the plurality of parallel arm resonators and ground.

17. The multiplexer according to claim 16, wherein the first filter further includes a second inductance element electrically connected between a second one of the plurality of parallel arm resonators and ground.

18. The multiplexer according to claim 1, wherein
the capacitance element is a first capacitance element connected in parallel to the first series arm resonator; and
a second capacitance element is connected in parallel to the first parallel arm resonator.

* * * * *